United States Patent
Alwardi et al.

[11] Patent Number: 5,965,997
[45] Date of Patent: Oct. 12, 1999

[54] BATTERY MONITORING CIRCUIT WITH STORAGE OF CHARGE AND DISCHARGE ACCUMULATION VALUES ACCESSIBLE THEREFROM

[75] Inventors: Milad Alwardi; Wallace Edward Matthews, both of Richardson; Dave Heacock; David Louis Freeman, both of Plano, all of Tex.

[73] Assignee: Benchmarq Microelectronics, Dallas, Tex.

[21] Appl. No.: 08/915,019

[22] Filed: Aug. 20, 1997

[51] Int. Cl.$^6$ .......................... H01M 10/46; H01M 10/44
[52] U.S. Cl. .............................................................. 320/132
[58] Field of Search ...................... 320/112, 114, 320/130, 132, 134, 135, 136, 128, FOR 131, FOR 138, FOR 142, FOR 147, DIG. 18, DIG. 21; 324/426, 427, 428

[56] References Cited

U.S. PATENT DOCUMENTS

| | | | |
|---|---|---|---|
| 4,851,839 | 7/1989 | Reinke | 324/99 D |
| 5,043,651 | 8/1991 | Tamura | 320/136 |
| 5,341,503 | 8/1994 | Gladstein et al. | 320/136 X |
| 5,412,323 | 5/1995 | Kato et al. | 320/152 X |
| 5,793,188 | 8/1998 | Cimbal et al. | 320/130 |

*Primary Examiner*—Edward H. Tso
*Attorney, Agent, or Firm*—Gregory M. Howison

[57] ABSTRACT

A battery charge/discharge monitor circuit (10) is operable to be disposed in a battery pack (12) which can be connected to a battery (13). The monitor circuit (10) is operable to be connected to an external CPU (24) or similar system through a single wire communication port (22) for transferring information back and forth. There is also provided an external signal on a line (30) for indicating charge or discharge activity in the monitor circuit (10). The monitor circuit (10) is operable to collect information regarding the amount of charge input to the battery and the length of time that the charge is input to the battery and also the amount of charge that is removed from the battery and the length of time that the charge is removed. This information is stored in a memory block (62) for later access by the external CPU (24). This system also provides offset information to provide some type of compensation for non-linearities of the part. This offset is determined during a calibration operation which operates over a long period of time during a period of inactivity. Regulation circuitry is operable to provide internal regulation to the circuitry with an external JFET (20).

31 Claims, 21 Drawing Sheets

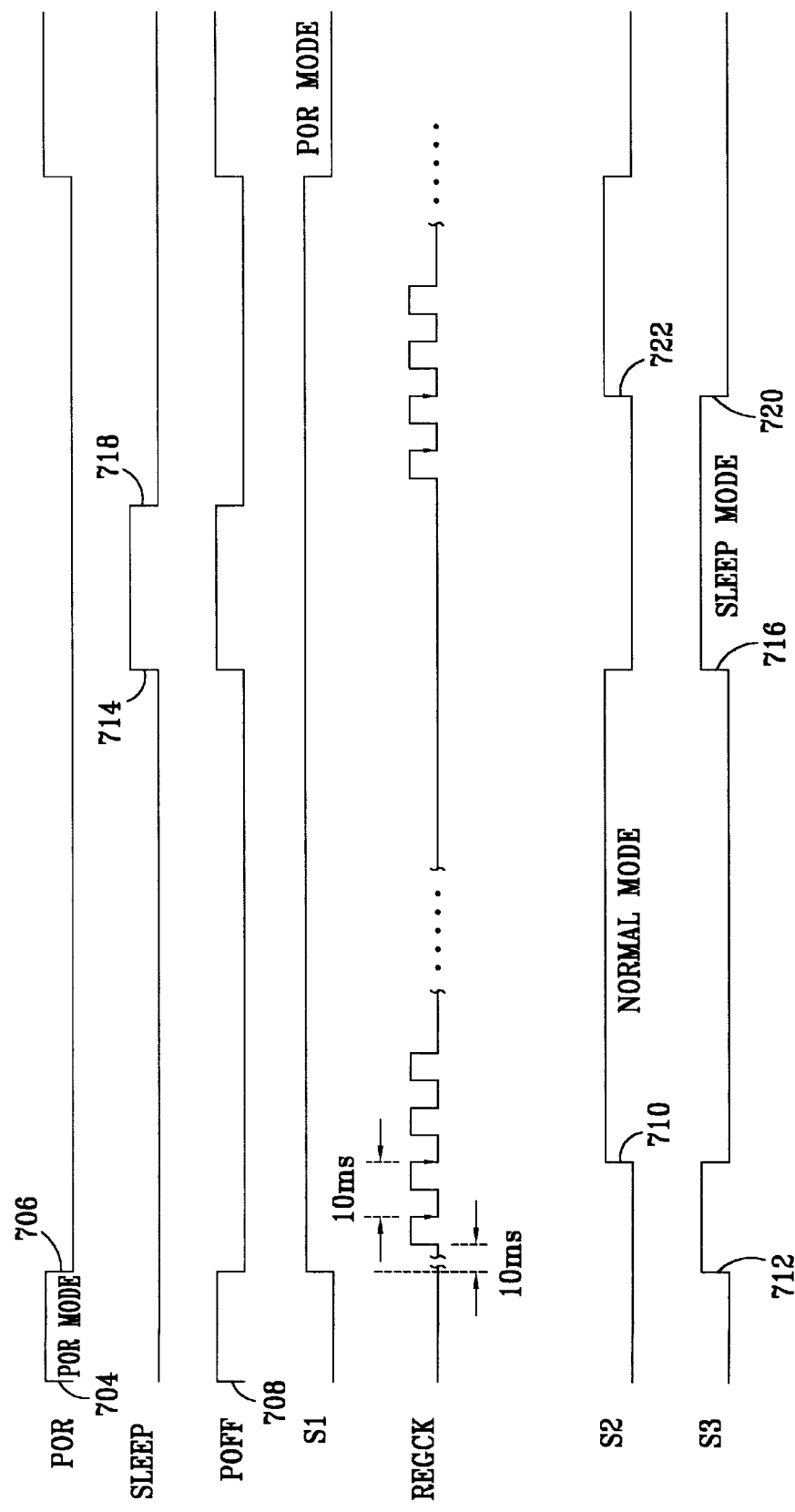

5,965,997

BATTERY MONITORING CIRCUIT WITH STORAGE OF CHARGE AND DISCHARGE ACCUMULATION VALUES ACCESSIBLE THEREFROM

CROSS-REFERENCE TO RELATED APPLICATIONS

This application is related to U. S. Pat. No. 5,357,203, issued Oct. 18, 1994, to Landau, et al., which reference is incorporated herein by reference.

TECHNICAL FIELD OF THE INVENTION

The present invention pertains in general to battery monitoring circuits and, more particularly, to a battery monitoring circuit that provides a battery charge/discharge monitor portion in a battery pack, which portion is interfaced with an external CPU through a single-wire communication port.

BACKGROUND OF THE INVENTION

Battery monitoring is achieved by a number of methods in order to provide information regarding the condition of the battery and also to assist in the charging operation of the battery. With the advent of portable computers and cellular telephones, the need for rechargeable batteries has seen a significant increase. The battery operated equipment has typically utilized NiCd technology, NiMH technology, or Lithium Ion technology. The chemistries associated with each of these technologies can vary such that different considerations must be evaluated. However, one of the fundamental pieces of information that is required in any type of monitoring operation is the amount of charge input to the battery and the amount of charge retrieved from the battery.

Typical charge/discharge circuits are configured with some type of sense resistor disposed in series with the battery which provides a voltage representing the current to or from the battery. The polarity of the voltage will determine the direction of current flow. These resistors are referred to as "sense resistors," which are relatively small resistors to reduce the power dissipation or energy loss therein. The voltage across the resistor is converted to current information and this current information utilized by the battery monitoring circuit to determine various aspects of the condition of the battery. One such application is described in U. S. Pat. No. 5,357,203, issued to Landau, et al., on Oct. 18, 1994, which is incorporated herein by reference, which discloses a battery monitoring circuit that includes a plurality of counters that are incremented or decremented, depending upon whether there is a charge operation or a discharge operation. These count values are then utilized for the purpose of determining conditions about the battery, such as the capacity of the battery, the discharge rate of the battery, etc. However, this is a multi-function part, which requires a relatively large number of pins and is fairly complicated. It is not necessary to have all of these functions included in a single chip. The reason for this is that a large amount of the processing can be done external to the chip and this processing can be altered to alter the actual monitoring operation. With a single chip monitoring circuit, the monitoring operation is relatively fixed due to the use of an internal microcontroller on the chip itself. For battery pack applications that require the display in the entire monitoring operation to be incorporated into the pack, a single chip solution is acceptable. However, when this information can be readily performed by an external CPU, then it is not necessary to incorporate all of the monitoring processing operation on the chip itself.

SUMMARY OF THE INVENTION

The present invention disclosed and claimed herein comprises a battery monitoring circuit for monitoring select parameters of a battery having positive and negative terminals. The battery monitoring circuit includes a charge determination circuit for determining information relative to current input to the battery as function of time. In association with the charge determination circuit is a charge accumulation register that is operable to store an accumulated charge value representing the amount of current input to the battery over time as determined by the charge determination circuit. Also included is a charge determination circuit for determining information relative to the current output from the battery as a function of time. Associated with the charge determination circuit is a discharge accumulation register for storing an accumulated discharge value representing the amount of current output from the battery as a function of time as determined by the discharge determination circuit. An input/output interface is provided to allow an external system to access the charge accumulation register and discharge accumulation register and the information stored therein.

In another aspect of the present invention, the charge determination circuit includes a charge timer for determining the amount of time the charge determination circuit is operating, and the discharge determination circuit includes a discharge timer for determining the amount of time the discharge determination circuit is operating. A discharge time register is operable to store information representing the accumulated time that the discharge timer is operating. A charge time register is provided for storing information representing the accumulated times that the charge timer is operating. Each of the charge and discharge time registers are accessible through the input/output interface. In a further aspect of the present invention, a sense resistor is disposed in series with one of a positive and negative terminals of the battery and each of the charge and discharge determination devices comprises a voltage-to-frequency converter circuit. This voltage-to-frequency converter circuit is operable to convert the voltage across the sense resistor to a pulse stream wherein each pulse represents a predetermined voltage level for unit time and at opposite polarities for each of the charge and discharge determination circuits. A counter is clocked by the voltage-to-frequency pulse stream wherein the output thereof is stored in the respective one of the charge accumulation and discharge accumulation registers.

In a yet further aspect of the present invention, a sleep device is provided to reduce current draw to the monitor circuit. The sleep device operates in response to a signal received from the external system through the input/output interface and the presence of activity on the output of the charge determination and discharge determination circuits. Inactivity is indicated when the charge and discharge levels are below a predetermined threshold. This sleep device includes an internal comparator for comparing the output value from the charge determination and discharge determination devices with a stored sleep threshold value stored in a sleep threshold register and then generating a true value indicating activity below a desired level when this value is less than the stored sleep threshold value.

In an even further aspect of the present invention, a calibration circuit is provided for determining the error in the charge determination and discharge determination circuit operation. This calibration circuit is operable to operate over a predetermined duration of time when there is no charging or discharging operation above the predetermined level.

During this time, the difference between the charge and discharge levels is accumulated and summed, such that an offset value can be generated and stored in an offset register. The contents of this offset register are accessible through the input/output interface to the external CPU.

BRIEF DESCRIPTION OF THE DRAWINGS

For a more complete understanding of the present invention and the advantages thereof, reference is now made to the following description taken in conjunction with the accompanying Drawings in which:

FIG. 25 illustrates a timing diagram for the regulator operation.

DETAILED DESCRIPTION OF THE INVENTION

Figure 1:
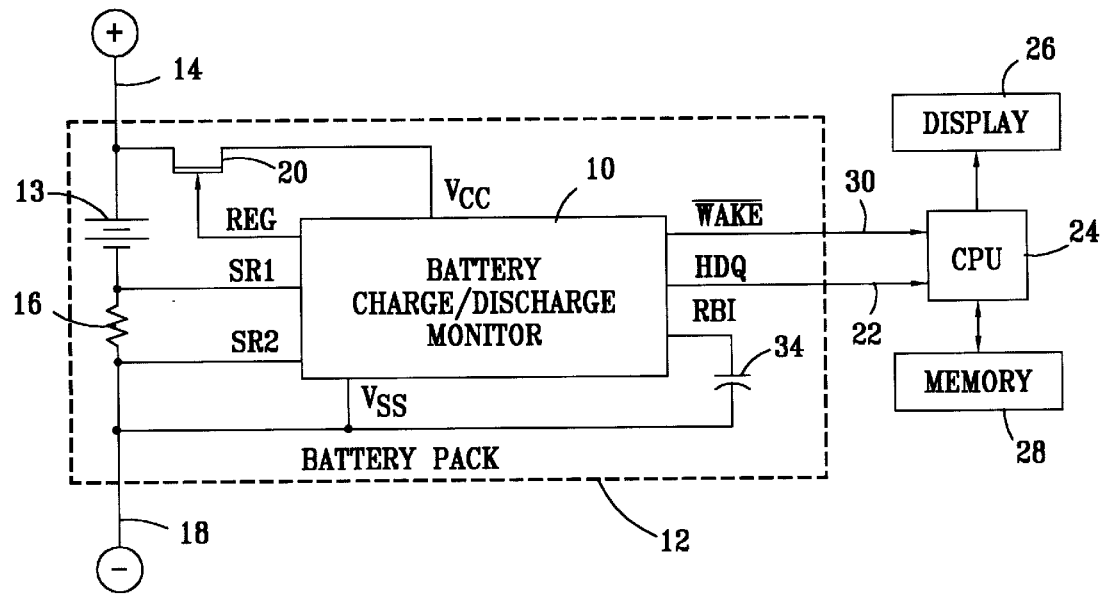
FIG. 1 illustrates an overall block diagram of the battery charge/discharge monitor circuit disposed in a battery pack interfaced with an external CPU.

Referring now to FIG. 1, there is illustrated a block diagram of a battery charge/discharge monitor circuit 10, which is disposed in a battery pack 12. The battery pack 12, in addition to the battery charge/discharge monitor circuit 10, includes a battery 13, which has the positive terminal thereof connected to an output positive terminal 14 and a negative terminal thereof connected to a sense resistor 16 and to an output negative terminal 18. The sense resistor 16 is connected to two inputs of the battery charge/discharge monitor circuit 10, one labeled SR1 and one labeled SR2. The battery charge/discharge monitor circuit 10 also includes a ground terminal $V_{SS}$, which is connected to the negative terminal 18. There is also provided a power terminal for the battery charge/discharge monitor circuit 10 labeled $V_{CC}$, which is connected to one side of a source/drain path of a junction FET (JFET) 20, which has the other side thereof connected to the positive terminal 14 and the gate thereof connected to an REG output of the battery charge/discharge monitor 10. The JFET 20 provides regulation for the monitor circuit 10 as a function of the single output on the REG terminal. There is also provided a serial communication port HDQ, which interfaces through a communication line 22 with an external device such as a CPU 24. It should be understood that the CPU 24 is provided for illustrative purposes and that any type of processing device or device that could utilize the information provided on the communication line 22 would be anticipated. The CPU 24 illustrated has associated therewith a display 26 and a memory 28, this being conventional. In addition to the serial communication port 22, a monitor output is provided on a line 30 which is labeled WAKE-Bar. This is an activity signal that indicates whether there is activity present in the monitor circuit 10. This will be described in more detail hereinbelow.

The monitor circuit 10 is, in general, a charge/discharge counter peripheral circuit that is packaged in 8-pin 150-mil SOIC. It is designed to work with an intelligent host controller, such as the CPU 24, to provide state-of-charge information for rechargeable batteries, the battery 13 being a rechargeable battery. As will be described in more detail hereinbelow, the monitor circuit 10 is operable to measure the voltage drop across the sense resistor 16 and, by then using the accumulated counts in the charge/discharge and self-discharge registers internal thereto, the CPU 24 can determine battery state-of-charge information in accordance with the various algorithms that were set forth in the above-noted U. S. Pat. No. 5,357,203 or any type of algorithm. As will also be described hereinbelow, there is provided an offset count register to improve accuracy. The CPU 24 as the system host controller is then responsible for the register maintenance by resetting the charge in/out and self-discharge registers as needed in signals transmitted through the serial communication line 22.

Internal to the monitor circuit 10 is a memory that allows for storage of 128 bytes of NVRAM/Registers. The upper 13 bytes of the NVRAM contain the capacity-monitoring status information. These are essentially the registers that will be described in more detail hereinbelow. There is provided an RBI input to the monitor circuit 10 that operates from an external power storage source, such as a large capacitor 34 connected between the RBI input and the $V_{SS}$ terminal that provides backup power to render the internal register/RAM cells non-volatile for periods when the battery is shorted to ground or when the battery charge state is insufficient to operate the monitor circuit 10. During this mode, the register backup current is reduced to less than 100 nA.

Figure 2:
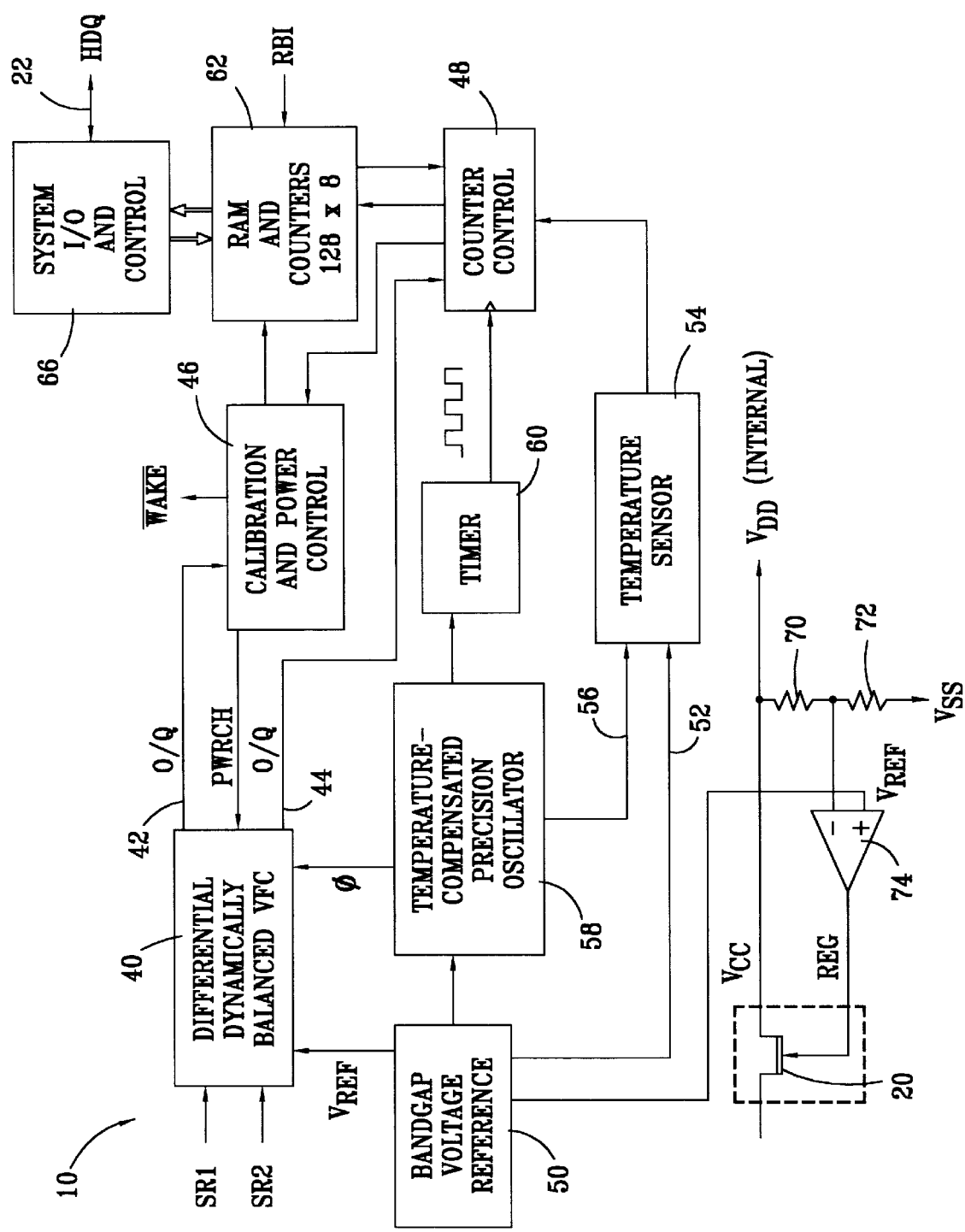
FIG. 2 illustrates a block diagram of the battery charge/discharge monitor circuit.

Referring now to FIG. 2, there is illustrated a detailed block diagram of the monitor circuit 10. The sensor resistor inputs SR1 and SR2 are input to a differential dynamically balanced voltage-to-frequency converter (VFC). The monitor 10 utilizes these two inputs SR1 and SR2 to interpret charge and discharge activity. The voltage $V_{SR1}$, being less than $V_{SR2}$ indicates discharge and the voltage $V_{SR1}$ greater than $V_{SR2}$ indicates charge. The effective voltage drop, $V_{SRO}$, seen by the monitor circuit 10, is $V_{SR}+V_{OS}$. The valid input range of the circuit is ±200 mV. The VFC 40 is operable to provide two outputs, a discharge output "D" and a charge output "Q." This is referred to as a D/Q line 42 and a D/Q line 44. The D/Q line 42 is input to a calibration and power control circuit 46 and D/Q line 44 is input to a counter control circuit 48, both of which will be described hereinbelow. The calibration and power control circuit 46 is operable to control the power-down and power-up operation of the VFC 40, in addition to other circuitry. Again, this will be described in more detail hereinbelow. There is provided a bandgap voltage reference generator 50, which is operable to generate a voltage $V_{REF}$. As will be described hereinbelow, this is utilized by the VFC 40. The bandgap voltage reference generator 50 is also operable to output a reference voltage on a line 52 to a temperature sensor circuit 54, which also receives an output on a line 56 from a temperature-compensated precision oscillator 58. This oscillator 58 also provides clock signals to the VFC 40 and to a timer 60. The timer 60 is operable to generate clock pulses for the counter control circuit 48 on a clock input thereto.

A RAM/counter circuit 62 is provided, which is operable to provide both random access memory and counters, in addition to registers. There are provided 128 bytes of storage, some of the storage being random access memory, some being counters, and some being registers, as will be described hereinbelow. The counters contained within the RAM and counter block 62 are controlled by the counter control 48. The counter output will, of course, be stored for access in the RAM and counter block 62. Calibration and power control signals are received from the calibration and power control block 46, which also interfaces with the counter control 48. The WAKE-Bar signal is provided as an output from the calibration and power control block 46. The RAM and counter control block 62 is operable to interface with the serial communication line 22 with a system I/O and control block 66.

The JFET 20, as described above, has the gate thereof connected to the REG output and one side of the source/drain path thereof connected to the $V_{CC}$ input. The $V_{CC}$ input constitutes the internal voltage that is provided to the chip, which is referred to as a voltage $V_{DD}$. This voltage is connected to one side of two series-connected resistors 70 and 72, the other side thereof connected to $V_{SS}$. The junction of the two resistors 70 and 72 is connected to the negative input of an op amp circuit 74, the positive input thereof connected to a voltage reference $V_{REF}$ output by the bandgap voltage reference circuit 50. The output of the op amp circuit 74 comprises the REG output.

Internal counters and timers provided by the monitor circuit 10 through the RAM and counter block 62 can be utilized by the CPU 24 for the purpose of determining battery state-of-charge, estimating self-discharge and calculating the average charge and discharge current into and out of the rechargeable battery: one register provided for charge, one register provided for discharge, one register provided for offset and one register provided for self-discharge. The monitor circuit 10 requires the external CPU 24 to perform all register maintenance primarily and exclusively through the serial communication port 22. Utilizing information provided by the monitor circuit 10, the CPU 24 can determine the battery state-of-charge, estimate self-discharge and calculate the average charge and discharge currents. During storage periods of the battery pack 12, the use of the internal temperature sensor circuit 54 doubles the self-discharge rate every 10°above 25° C.

To reduce overall cost, power to the monitor circuit 10 can be derived utilizing the JFET 20 in conjunction with the REG input. The overall operating current of the monitor circuit 10 is less than a micro Amp. When the serial HDQ input from the communication line 22 remains low for greater than 10 seconds and $V_{SRO}$ ($V_{SR}+V_{OS}$, where $V_{SR}$ is the voltage drop between SR1 and SR2 and $V_{OS}$ is the offset voltage) is below the programmed minimal levelWAKE-Bar is in the high state, the monitor circuit 10 enters a Sleep Mode of less than 10 micro Amps, where all operations are suspended. Whenever the signal HDQ makes a transition to a high level, the operation of the monitor circuit 10 is reinitiated, thus allowing the external CPU 24 to control this operation.

A register is provided in the monitor circuit 10 in the RAM and counter block 62 to store the calculated offset, allowing for offset calibration, as will be described in more detail hereinbelow. The offset calibration register is written by the monitor circuit 10 during assembly of the battery pack 12 as available to the host system to adjust the current measurements. By adding or subtracting the offset value stored in the offset register, the true charge and discharge counts can be calculated to a high degree of certainty. The overall operational states with respect to the HDQ pin, and the contents of the discharge count register (DCR), the charge count register (CCR) and the self-discharge count register (SCR) are set forth in Table 1. In Table 1 there is provided the status of the HDQ pin, the DCR/CCR/SCR registers, the write output enable (WOE) state, and the WAKE-Bar state are set forth.

TABLE 1

Operational States

| HDQ Pin | DCR/CCR/SCR | WOE | WAKE | Operating State |
|---|---|---|---|---|
| HDQ High | yes | $|V_{SRO}| > V_{WOE}$ | Low | Normal |
| HDQ High | yes | $|V_{SRO}| < V_{WOE}$ | High Z | Normal |
| HDQ Low | no | $|V_{SRO}| < V_{WOE}$ | High Z | Sleep |

Note:
$V_{SRO}$ is the voltage difference between SR1 and SR2 plus the offset voltage $V_{OS}$.

In the operation of the charge/discharge count, there are provided a plurality of main counters and registers. These are set forth in Table 2.

TABLE 2 bq2018 Counters

| Name | Description | Range | RAM Size |
|---|---|---|---|
| DCR | Discharge count register | $V_{SR1} < V_{SR2}$ (Max. = −200mV) 12.5 μVh increments | 16-bit |
| CCR | Charge count register | $V_{SR1} > V_{SR2}$ (Max. = +200mV) 12.5 μVh increments | 16-bit |
| SCR | Self-discharge count register | 1 count/hour @ 25° C. | 16-bit |
| DTC | Discharge time counter | 1 count/0.8789 seconds | 16-bit |

TABLE 2-continued bq2018 Counters

| Name | Description | Range | RAM Size |
|---|---|---|---|
| CTC | Charge time counter | 1 count/0.8789 seconds | 16-bit |
| MODE/ WOE | MODE/ Wake Output enable | — | 8-bit |
| TMP/ CLR | Temperature/ Clear register | — | 8-bit |

The monitor circuit 10 is operable to accumulate charge and discharge counts into two main count registers, the discharge count register (DCR) and the charge count register (CCR). The monitor circuit 10 produces charge and discharge counts by sensing the voltage difference across a low value resistor between the negative terminal of the battery pack 12 and the negative terminal of the battery 13. The DCR and CCR independently count depending on the signal between SR1 and SR2.

During discharge, the DCR and the Discharge Time Counter (DTC) are active. If $V_{SR1}$ is less than $V_{SR2}$, indicating a discharge, the DCR counts at a rate equivalent to 12.5 $\mu$V every hour, and the DTC counts at a rate of 1 count/0.8789 seconds (4096 counts=1 hour). For example, a −100 mV signal produces 8000 DCR counts and 4096 DTC counts each hour. The amount of charge removed from the battery can easily be calculated.

During charge, the CCR and the Charge Time Counter (CTC) are active. If $V_{SR1}$ is greater than $V_{SR2}$, indicating a charge, the CCR counts at a rate equivalent to 12.5 $\mu$V every hour, and the CTC counts at a rate of 1 count/0.8789 seconds. For example, a +100 mV signal produces 8000 CCR counts and 4096 CTC counts each hour. The amount of charge added to the battery can easily be calculated.

Whenever the signal between SR1 and SR2 is above the Wake-up Output Enable (WOE) threshold and the HDQ pin is high, the monitor circuit 10 is in its full operating state. In this state, the DCR, CCR, DTC, CTC and SCR registers are fully operational and the WAKE-Bar output is low. During this mode, the internal RAM registers in the block 62 may be accessed over the HDQ pin, as described hereinbelow.

If the signal between SR1 and SR2 is below the WOE threshold, and HDQ remains low for greater than 10 seconds, the monitor circuit 10 enters a Sleep Mode wherein all register counting is suspended. The monitor circuit 10 remains in this mode until HDQ returns high.

For self-discharge calculation, the self-discharge count register (SCR) counts at a rate equivalent to one count every hour at a nominal 25° C. and doubles approximately every 10° C. up to 60° C. The SCR count rate is halved every 10° C. below 25° C. down to 0°C. The value in SCR is useful in determining an estimation of the battery self-discharge based on capacity and storage temperature conditions. As noted above, this is carried out external to the monitor circuit 10.

Monitor circuit 10 may be programmed to measure the voltage offset between voltage SR1 and SR2 during assembly of the battery pack 12 or at any time by invoking the Calibration mode, thus being controlled by the CPU 24. The Offset Register (OFR) is utilized to store this offset. The 8-bit 20's complement value stored in the OFR is scaled to the same units as the DCR and CCR, representing the amount of positive or negative offset in the monitor circuit 10. The maximum offset for the monitor circuit 10 is specified as ±500 $\mu$V. Using the OFR, the system host CPU 24 can cancel most of the effects of the monitor circuit 10 offset for greater resolution and accuracy.

The memory map for the memory block 62 is arranged such that monitor circuit 10 is allowed to use the upper thirteen locations. This is from location 73h–7Fh. The following Table 3 illustrates the memory mapping operation.

TABLE 3

Address Map

| 7f | Discharge count high byte |
| 7e | Discharge count low byte |
| 7d | Charge count high byte |
| 7c | Charge count low byte |
| 7b | Self-discharge high byte |
| 7a | Self-discharge low byte |
| 79 | Discharge time high byte |
| 78 | Discharge time low byte |
| 77 | Charge time high byte |
| 76 | Charge time low byte |
| 75 | Mode/wake output enable |
| 74 | Temperature/clear |
| 73 | Offset register |

The remaining locations are used to store user-sensitive information, such as chemistry, serial number and manufacturing date. These locations, as will be described hereinbelow, are accessible only by the user for a Read operation or a Write operation and the monitor circuit 10 does not utilize these locations.

The WAKE-Bar output is utilized to inform the system that the voltage difference between SR1 and SR2 is above or below the Wake Output Enable (WOE) threshold programmed in the MODE/WOE register. When the voltage difference between SR1 and SR2 is below $V_{WOE}$, the WAKE-Bar output goes into high impedance, and remains in this state until the discharge or charge current increases above the specified value. The MODE/WOE resets the WOE threshold $f_h$ after a power-on reset. $V_{WOE}$ is set by dividing 3.84 mV by a value between 1 and 7 (1h–7h) according to Table 4.

TABLE 4

WOE Thresholds

| WOE (hex) | $V_{WOE}$ (mV) |
|---|---|
| 0h | n/a |
| 1h | 3.84 |
| 2h | 1.92 |
| 3h | 1.28 |
| 4h | 0.96 |
| 5h | 0.768 |
| 6h | 0.64 |
| 7h | 0.549 |

As noted above, the monitor circuit 10 has an internal temperature sensor that is utilized to set the value of the temperature register (TMP/CLR) and set the self-discharge count rate value. The register reports the temperature in eight steps of 10° C. from <0° C. to >60° C., as set forth in Table 5. The monitor circuit 10 temperature sensor has typical accuracy of ±2° C. at 25° C. This will be described in more detail hereinbelow.

TABLE 6

Temperature Steps

| Temp | Value (hex) |
| --- | --- |
| <0° | 0h |
| 1–10° | 1h |
| 10–20° | 2h |
| 20–30° | 3h |
| 30–40° | 4h |
| 40–50° | 5h |
| 50–60° | 6h |
| >60° | 7h |

The Clear register is responsible for register maintenance. To facilitate this maintenance, the monitor circuit 10 has a Clear Temperature Register (TMP/CLR) designed to reset the specific counter or register pair to zero. The host system clears a register by writing the corresponding register bit to "1." When the monitor circuit 10 completes the reset, the corresponding bit in the TMP/CLR register is automatically reset to "0", which saves the host or CPU 24 an extra Write/Read cycle.

In the calibration mode, the monitor circuit 10 can enable $V_{OS}$ calibration by setting the calibration bit in the MODE/WOE register (Bit 6) to "1". The monitor circuit 10 then enters calibration mode when the HDQ line is low for greater than 10 seconds and when the signal between SR1 and SR2 is below WOE. If HDQ remains low for one hour and the absolute value of $V_{SR}$ is less than $V_{WOE}$ for the entire time, the measured $V_{OS}$ is latched into the OFR register, and the calibration bit is reset to zero, indicating to the system that the calibration cycle is complete. Once calibration is complete, the monitor circuit 10 enters a low-power mode until HDQ goes high, indicating an external system is ready to access the monitor circuit 10. If HDQ transitions high prior to completion of the $V_{OS}$ calculation, or if the absolute value of $V_{SR}$ is greater than the $V_{WOE}$, then the calibration cycle is reset. The monitor circuit 10 then postpones the calibration cycle until the conditions are met. The calibration bit does not reset to zero until a valid calibration cycle is completed. The requirement for HDQ to remain low for the calibration cycle can be disabled by setting the OVRDQ bit to "1." In this case, calibration continues for as long as the absolute value of $V_{SR}$ is less than $V_{WOE}$. The OVRDQ bit is reset to zero at the end of a valid calibration cycle.

The communications protocol on the HDQ pin is a serial data interface. The CPU 24 utilizes the contents of various registers in the monitor circuit 10. The interface to these registers utilizes a command-based protocol, where the CPU 24 sends a command byte to the monitor circuit 10. The command directs the monitor circuit 10 either to store the next eight bits of data received by a register specified by the command byte or to output the bits of data from a register specified by the command byte. The communication protocol is asynchronous return-to-one. Command and data bytes consist of a stream of eight bits that have a maximum transmission rate of 5K bits/sec. The least-significant bit of a command or data byte is transmitted first. The protocol is simple enough that it can be implemented by most host processors using either polled or interrupt processing. Data input from the monitor circuit 10 may be sampled using the pulse-width capture timers available on some microcontrollers. A UART may also be utilized to communicate through the HDQ pin.

If a communication timeout occurs, e.g., the CPU 24 waits longer than $t_{CYCB}$ for the monitor circuit 10 to respond, then a BREAK should be sent by the host. This is illustrated in a timing diagram of FIG. 2a. The host may then resend the command. The monitor circuit 10 detects a BREAK when the HDQ pin is driven to a logic-low state for a time, $t_B$, or greater. The HDQ pin then returns to its normal ready-high logic state for a time, $t_{BR}$. The monitor circuit 10 is then ready to receive a command from the CPU 24.

The return-to-one data bit frame consists of three distinct sections. The first section is utilized to start the transmission by either the CPU 24 or the monitor circuit 10 taking the HDQ pin to a logic-low state for a period, $t_{STRHB}$. The next section is the actual data transmission, where the data should be valid by a period, $t_{DSUB}$, after the negative edge utilized to start communication. The data should be held for a period, $t_{DV}/t_{DH}$, to allow the host or monitor circuit 10 to sample the data bit.

Figure 2A:
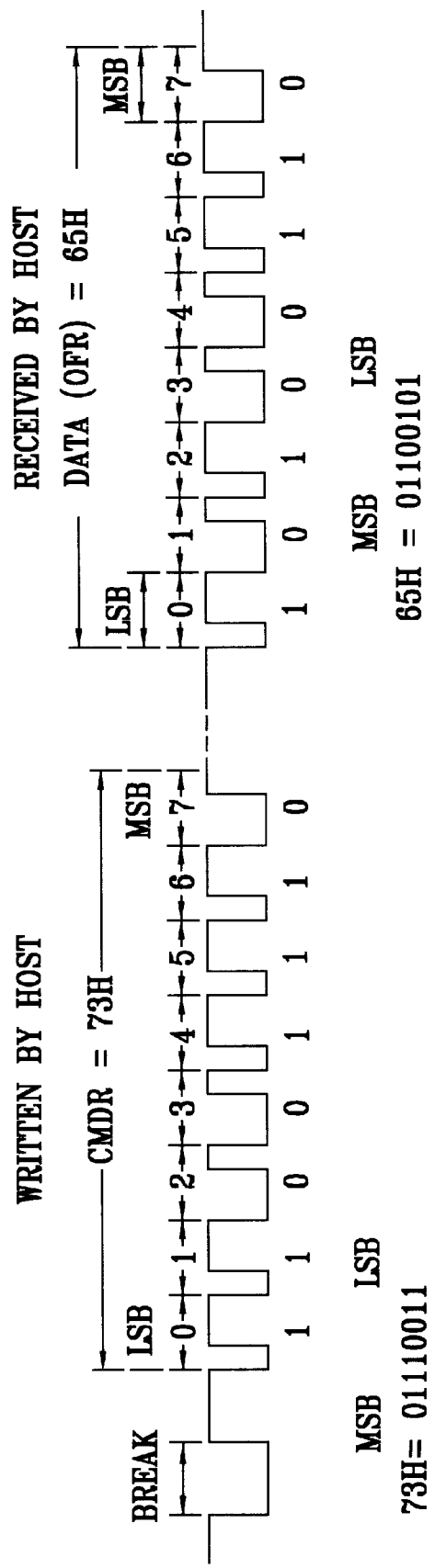
FIG. 2a illustrates a timing diagram for the communication between the host and the monitor circuit.

The final section is utilized to stop the transmission by returning the HDQ pin to a logic-high state by at least a period, $t_{SSU}$, after the negative edge utilized to start communication. The final logic-high state should be held until a period, $t_{CYCHB}$, to allow time to ensure that the bit transmission ceased properly. Communication with the monitor circuit 10 always occurs with the least-significant bit being transmitted first. This is illustrated in FIG. 2a.

The monitor circuit 10 command and status registers are listed in Table 7 below.

TABLE 7

Monitor Circuit Command and Status Registers

| Symbol | Register Name | Loc. (hex) | Read/ Write | Control Field | | | | | | | |
| --- | --- | --- | --- | --- | --- | --- | --- | --- | --- | --- | --- |
| | | | | 7(MSB) | 6 | 5 | 4 | 3 | 2 | 1 | 0(LSB) |
| CMDR | Command register | — | Write | W/R | AD6 | AD5 | AD4 | AD3 | AD2 | AD1 | AD0 |
| DCRH | Discharge count register high byte | 7f | Read | DCRH7 | DCRH6 | DCRH5 | DCRH4 | DCRH3 | DCRH2 | DCRH1 | DCRH0 |
| DCRL | Discharge count register low byte | 7e | Read | DCRL7 | DCRL6 | DCRL5 | DCRL4 | DCRL3 | DCRL2 | DCRL1 | DCRK0 |
| CCRH | Charge count register high byte | 7d | Read | CCRH7 | CCRH6 | CCRH5 | CCRH4 | CCRH3 | CCRH2 | CCRH1 | CCRH0 |

TABLE 7-continued

Monitor Circuit Command and Status Registers

| Symbol | Register Name | Loc. (hex) | Read/ Write | \ | \ | \ | Control Field | \ | \ | \ | \ |
|---|---|---|---|---|---|---|---|---|---|---|---|
| | | | | 7(MSB) | 6 | 5 | 4 | 3 | 2 | 1 | 0(LSB) |
| CCRL | Charge count register low byte | 7c | Read | CCRL7 | CCRL6 | CCRL5 | CCRL4 | CCRL3 | CCRL2 | CCRL1 | CCRL0 |
| SCRH | Self-discharge count register high byte | 7b | Read | SCRH7 | SCRH6 | SCRH5 | SCRH4 | SCRH3 | SCRH2 | SCRH1 | SCRH0 |
| SCRL | Self-discharge count register low byte | 7a | Read | SCRL7 | SCRL6 | SCRL5 | SCRL4 | SCRL3 | SCRL2 | SCRL1 | SCRL0 |
| DTCH | Discharge time count high byte | 79 | Read | DTCH7 | DTCH6 | DTCH5 | DTCH4 | DTCH3 | DTCH2 | DTCH1 | DTCH0 |
| DTCL | Discharge time count low byte | 78 | Read | DTCL7 | DTCL6 | DTCL5 | DTCL4 | DTCL3 | DTCL2 | DTCL1 | DTCL0 |
| CTCH | Charge time count high byte | 77 | Read | CTCH7 | CTCH6 | CTCH5 | CTCH4 | CTCH3 | CTCH2 | CTCH1 | CTCH0 |
| CTCL | charge time count low byte | 76 | Read | CTCL7 | CTCL6 | CTCL5 | CTCL4 | CTCL3 | CTCL2 | CTCL1 | CTCL0 |
| MODE/ WOE | MODE/ wake-up output enable | 75 | Read/ Write | OVRDQ | CAL | STC | STD | WOE3 | WOE2 | WOE1 | 0 |
| TMP/ CLR | Temperature/Clear register | 74 | Read/ Write | TMP2 | TMP1 | TMP0 | CTC | DTC | SCR | CCR | DCR |
| OFR | offset register | 73 | Read/ Write | OFR7 | OFR6 | OFR5 | OFR4 | OFR3 | OFR2 | OFR1 | OFR0 |
| RAM | User memory | 72-00 | Read/ Write | — | — | — | — | — | — | — | — |

The command register (CMDR) is a Write-only register that is accessed when the monitor circuit 10 has received eight contiguous valid command bits. The command bit register contains two fields, the Write/Read field, which consists of only a single bit, and the command address, which consists of seven bits, the least most significant bits. The Write/Read bit of the command register is utilized to select whether the received command is for a Read or Write function. The values are either "0" or "1." For a "0" value, the monitor circuit 10 outputs the requested register specified by the address portion of the CMDR. For a "1" value, the following eight bits should be written to the register specified by the address portion of the CMDR. The lower 7-bit field of the CMDR contains the address portion of the register to be accessed.

The discharge count registers provide a high byte register DCRH with an address of 7fh and a low-byte register DCRL, with an address of 7eh, which contain the count of the discharge. These registers are incremented whenever $V_{SR1} < V_{SR2}$. These registers continue to count beyond ffffh, such that proper register maintenance should be done by the host system. A Clear Register is provided to reset DCRH/DCRL to zero.

The charge count registers are comprised of a high-byte register CCRH (address=7d) and a low-byte register CCRL (address=7c) which contain the count of the charge and are incremented whenever $V_{SR1} > V_{SR2}$. These registers continue to count beyond ffffh, such that proper register maintenance can be done by the host system. A Clear Register is provided to reset CCRH/CCRL to zero.

Self-discharge registers are comprised of a high-byte register SCRH (address=7b) and a low-byte register SCRL (address=7ah), which contain the self-discharge count. This register is continually updated whenever the monitor circuit 10 is in its normal operating mode. The counts in these registers are incremented based on time and temperature. The SCRH counts at a rate of one count per hour at 25° C. and doubles every 10° C. up to temperature greater than 60° C. (16 counts/hour). The count will halve every 10° C. below 25° C. down to a temperature less than 0° C. (1 count/8 hours). These registers continue to count beyond ffffh, such that proper register maintenance can be performed by the host system. A Clear Register is provided to reset SCRH/SCRL.

The discharge time count registers are comprised of a high-byte register DTCH (address=79h) and a low-byte register DTCL (address=78h), which are utilized to determine the length of time the $V_{SR1} < V_{SR2}$ indicating a discharge. The counts in these registers are incremented at a rate of 4096 counts per hour. If the DTCH/DTCL register continue to count beyond ffffh, the STD bit is set in the mode register, signifying a register rollover. With this bit set, the DTCH/DTCL register will count at a rate of 16 counts per hour. The DTCH/DTCL register will continue to count beyond ffffh, such that proper register maintenance can be performed by the host system. A Clear Register is provided to reset DTCH/DTCL and STD.

The charge time count registers are comprised of a high-byte register CTCH (address=77) and a low-byte register CTCL (address=76), which are utilized to determine the length of time that $V_{SR1} > V_{SR2}$ indicating a charge operation. The counts in these registers are incremented at a rate of 4096 counts per hour. The CTCH/CTCL register continues to count beyond ffffh, the STC bit is set in the control register, signifying a register rollover. With this bitset, the CTCH/CTCL register will count at a rate of 16 counts per hour. The CTCH/CTCL register will continue to count beyond ffffh, such that proper register maintenance can be performed by the host system. A Clear Register is provided to reset CTCH/CTCL and STC.

The Mode/Wake-up Enable register (address=75) contains calibration and wake-up enable information. The override DQ(OVRDQ) bit (bit 7) is utilized to override the requirement for HDQ to be low prior to initiating $V_{OS}$ calibration. This bit is normally set to zero. If OVRDQ is written to one, the monitor circuit 10 begins offset calibration when the absolute value of $V_{SR}$ is less than $V_{WOE}$, where HDQ is in a "don't care" state. When OVRDQ is at "0," HDQ is set to "0" and the absolute value of $V_{SR}$ is less than $V_{WOE}$ for $V_{OS}$ calibration to begin. When OVRDQ is "1," HDQ is set to a "don't care" state and the absolute value of $V_{SR}$ is less than $V_{WOE}$ for $V_{OS}$ calibration to begin. After a valid calibration cycle, bit 7 is always reset to zero. The calibration bit is bit 6 (CAL) and is utilized to enable the monitor circuit 10 to do the offset calibration. Setting this bit to "1" enables a $V_{OS}$ calibration whenever HDQ is low (default), and the absolute value of $V_{SRO}$ is less than $V_{WOE}$. This bit is cleared to "0" by the monitor circuit 10 whenever a valid $V_{OS}$ calibration is completed, and the OFR register is updated with the new calculated offset. The bit remains "1" if the offset calibration is not completed. The CAL bit is "0" for a valid offset calibration and "1" for an offset calibration pending.

The Wake-Up Output Enable (WOE) bits (bits 3–1) are used to set the Wake-Up Enable signal level. Whenever the absolute value of $V_{SRO} < V_{WOE}$, the WAKE-Bar output is in a high impedance state. If the absolute value of $V_{SRO}$ was greater than $V_{WOE}$, WAKE-Bar transitions to low. On initialization of the monitor circuit 10 (power-on reset) these bits are set to "1." Setting all of these bits to zero is not valid. This was illustrated in Table 4 hereinabove. The WOE values for bits 3–1 are WOE3, WOE2, and WOE1, respectively. The values of WOE3-1 are determined by dividing 7.68 mV by the value in the WOE location.

The TMP/CLR register (address=74) is utilized to give the present temperature step between <0° C. to >60° C. and clear the various count registers. The values of the TMP0–TMP2 (bits 5–7) denote the current temperature step sensed by the monitor 10 as set forth in Table 6. The temperature sense is trimmed to ±2° C. typical (±4° C. maximum). The TMP2–0 values in bits 7–5 are TMP2, TMP1 and TMP0, respectively.

The Clear bits (Bits 0–4) are utilized to reset the various counters to zero. Writing the bits to "1" resets the corresponding register to "0." The clear bit resets to "0" indicating a successful register reset. Each clear bit is independent, such that it is possible to clear the DCRH/DCRL registers without affecting the values in any other register. The high-byte and low-byte registers are both cleared when the corresponding bit is written to "1." The CLR bits 4–0 correspond to counters CTC, DTC, SCR, CCR and DCR. CTC resets both CTCH and CTCL and STD to "0." The DTC bit resets both DTC and DTCL registers to "0." The SCR bit, bit 2, resets both SCRH and SCRL register to "0."

The CCR bit, bit 1, resets both CCRH and CCRL and STD to "0." The DCR bit, bit 0, resets both the DCRH and DCRL registers to "0."

The offset registers, OFR, (address=73h) is utilized to store the calculated $V_{OS}$ value. The OFR value can be utilized to cancel the voltage offset between $V_{SR1}$ and $V_{SR2}$. The up/down offset counter is centered at zero. The actual offset is an 8-bit two's complement value located in the OFR register. The value of OFR7 will indicate a discharge operation when it is set to a "1" and a charge operation when it is set to a "0."

Figure 3:
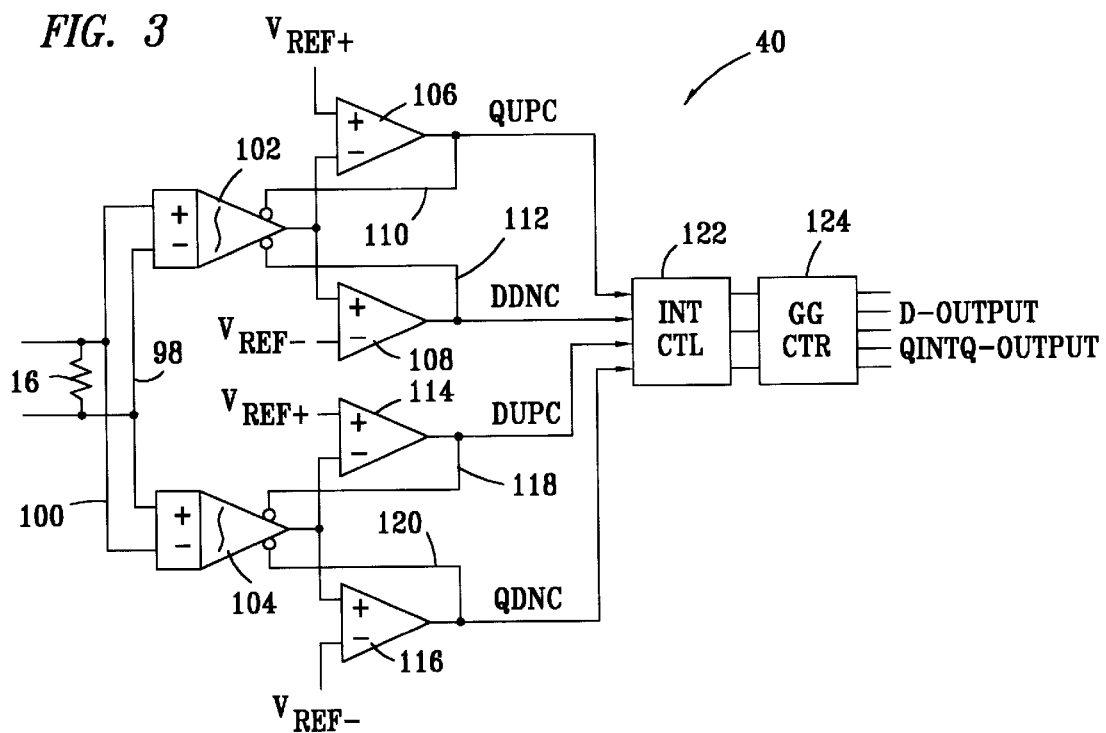
FIG. 3 illustrates a block diagram of the voltage-to-frequency converter.

Referring now to FIG. 3, there is illustrated a logic diagram of the voltage/frequency converter 40 of FIG. 2. The sense resistor 16 is connected across two input lines 98 and 100. Two integrators 102 and 104 are provided, with one integrator 102 providing an integration voltage that increases as voltage increases and the other integrator 104 providing an integration output that decreases as voltage increases. The lines 98 and 100 are connected to opposite inputs on both integrators 102 and 104. The integrator 102 has the output thereof connected to the negative input of a comparator 106 and to the positive input of a comparator 108. The positive input of comparator 106 is connected to a positive reference voltage and the negative input of comparator 108 is connected to a negative reference voltage. The positive reference voltage is at a voltage of approximately 1.2 volts and the negative reference voltage is at a voltage of approximately 0.6 volts. The output of comparator 106 provides an output QUPC that indicates an up charge count whereas the output of the comparator 108 provides an output DDNC that represents a down discharge count operation.

The output of the integrator 102 is a ramp voltage that increases as the voltage increases such that when it is above the negative reference voltage, the output of the comparator 108 will be high and when it is below the positive reference voltage, the output of comparator 106 is also high. When the voltage rises above the positive reference voltage, the output of comparator 106 goes low, and resets the integrator 102 through a line 110 to a voltage that is approximately 400 millivolts lower. This will result in the output of comparator 106 again going high, resulting in a pulse. The output of the integrator 102 will then again increase to above the positive reference voltage, assuming that the voltage across the sense resistor 16 is still high, until the output of comparator 106 again goes low. This results in a pulse stream on the output thereof having a frequency that is a function of the voltage across the sense resistor 16. During a discharge operation, the voltage polarity on sense resistor 16 will be reversed and integrator 102 will have a negative going ramp. When the negative going ramp falls below 0.6 volts, the voltage of the negative reference voltage, the output of comparator 108 will go low, inputting a reset signal to the comparator 102 through a reset line 112 to raise the voltage approximately 400 millivolts. If the discharge continues, a stream of pulses will be present on the output of comparator 108 indicating a discharge operation.

The output of integrator 104 is connected to the negative input of a comparator 114, the positive input of which is connected to the positive reference voltage. The output of integrator 104 is also connected to the positive input of a comparator 116, the negative input of which is connected to the negative reference voltage. The output of comparator 114 is connected to a reset input of the integrator 104 through a reset line 118 and the output of comparator 116 is connected to a reset input of the integrator 104 through a reset line 120. The integrator 104 provides a negative going ramp for a positive voltage and a positive going ramp for a negative voltage. Therefore, for a positive voltage, the comparator 116 will change states when the output of integrator 104 goes below the negative reference voltage and will be reset higher by 400 millivolts through the line 120. This will result in a pulse stream on the output thereof. Similarly, when a negative voltage is present, a pulse stream will result on the output of the comparator 114.

The outputs of the comparators 106 and 108 and the comparators 114 and 116 are input to an Integrator Control Circuit (INTCTL) 122 which is operable to compare the two outputs QUPC and QDNC and the outputs DDNC and DUPC to account for offsets in the integrators 102 and 104. Since integrators 102 and 104 are identical, the offsets will cancel each other. The pulse streams are phased such that they will not overlap, such that the pulse stream that is output by the combination, which is the function of ORing the two pulse streams together, will be the offset error free pulse stream. The integrator control circuit 122 then generates three signals, one output which is high only when the charge count is present, indicating a charge, one output which is high when only the discharge count is present, indicating a discharge, one output which is high when both the charge count and discharge a count are present, indicating both states present. This therefore represents three separate states. These three separate states are input to a state machine which is comprised of a three-state counter 124 that generates the D-output and the Q-output. These are then input to the NOR gate 76 for input to the interrupt input of the microcontroller 64.

Figure 4:
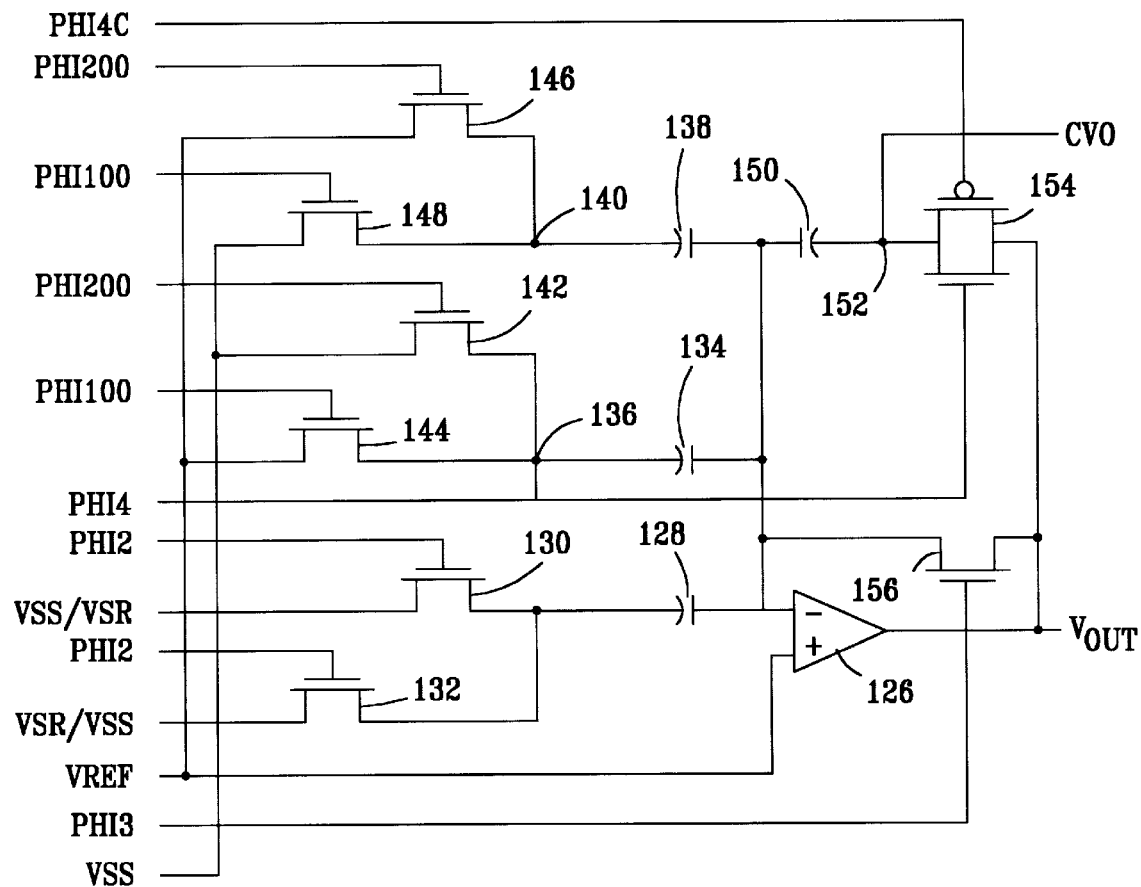
FIG. 4 illustrates a schematic diagram of a portion of the voltage-to-frequency converter.

Referring now to FIG. 4, there is illustrated a detailed logic diagram of each of the integrators 102 and 104. An operational amplifier 126 is provided having the negative input connected to the positive side of a capacitor 128 and the positive input thereof connected to a voltage $V_{REF}$. The other side of the capacitor 128 is connected to one side of the source/drain path of a transistor 130 and also to one side of the source/drain path of a transistor 132. The other side of the source/drain path of transistor 130 is connected to an input signal $V_{SS}/V_{SR}$ and the other side of the source/drain path of transistor 132 is connected to an input voltage $V_{SS}/V_{SR}$. Since the sense resistor 16 is connected between the $V_{SR}$ and $V_{SS}$ inputs, the integrator will provide a positive integration ramp as a function of current when the input to transistor 132 is greater than the input to transistor 130. The gates of transistors 130 and 132 are connected to two clock signals for controlling the operation thereof to alternately dispose the negative plate of capacitor 128 at either of the two voltages. This is essentially a switched-capacitor operation. A first reset capacitor 134 has a positive plate thereof connected to the negative input of the op amp 126 and the negative input thereof connected to a node 136. A second reset capacitor 138 has the positive input thereof connected to the negative input of the op amp 126 and the negative plate thereof connected to a node 140. Node 136 is connected through the source/drain path of a transistor 142 to $V_{SS}$ and also through the source/drain path of a transistor 144 to the voltage $V_{REF}$. Similarly, the node 140 is connected through the source/drain path of a transistor 146 to $V_{REF}$ and also through the source/drain path of a transistor 148 to $V_{SS}$. The gates of transistors 142 and 144 are controlled by reset clocks to switch the bottom plate of the capacitor between $V_{SS}$ and $V_{REF}$ and, similarly, the gates of transistors 146 and 148 are controlled by reset clock signals to switch the negative plate of the capacitor 138 between $V_{SS}$, and $V_{REF}$. One of the capacitors 134 and 138 is controlled such that it is charged to $V_{REF}$ and then switched to $V_{SS}$ during a reset operation to place a negative voltage on the input to the op amp 126. The other of the two capacitors 134 and 138 has the clock signals controlled such that the negative plate thereof resides at $V_{SS}$ during normal operation and is switched to $V_{REF}$ during a reset operation to provide a positive voltage change on the input to the op amp 126. These positive and negative voltage changes result in a corresponding positive and negative voltage change on the output of the op amp 126 of approximately 400 millivolts. An integration capacitor 150 is connected between the negative input to the op amp 126 and a node 152. The node 152 is connected to one side of a transfer gate 154 comprised of a P-Channel transistor and an N-Channel transistor, the other side of the transfer gate 154 connected to the output of the op amp 126. The gates of the transistors in the transfer gate 154 are controlled by clock signals. A transistor 156 has a source/drain path connected between the negative input and the output of the op amp 126 to allow the offset of amplifier 126 to be sampled during the first phase of integration, the gate of transistor 156 controlled by a clock signal.

Figure 5:
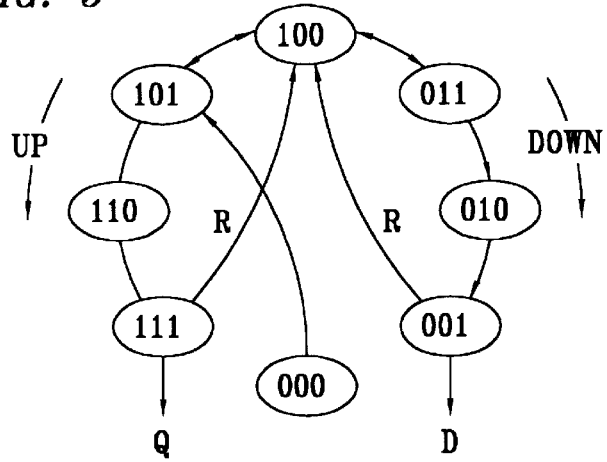
FIG. 5 illustrates a state diagram for the voltage-to-frequency converter.

Referring now to FIG. 5, there is illustrated a state diagram for the operation of the three-state counter 124. There are effectively eight states represented for all the binary combinations of the three-bit input. Whatever the system is initialized with a "000", the system is reset to the state "101". Whenever a charge count is indicated, the system will count upward for each pulse output by the combination of QUPC and QDNC, indicating a charging operation. Conversely, for each pulse output by the combination of DDPC and DUPC, the count will be decremented. The three states that are input will either cause the states to increase or decrease. When they decrease to a value "001", this results in the D-output outputting a pulse. Whenever the Q-output is generated or the D-output is generated, the states will reset itself back to the state "100". As such, it will require four output pulses from the V/F converter 40 to provide one Q-output or D-output pulse. Therefore, integration control circuit 122 and the counter 124 provide a low pass filter operation on the charge count stream and the discharge count stream. As will be described hereinbelow, these two output streams are utilized to increment and decrement software counters that represent the battery capacity state.

Figure 6:
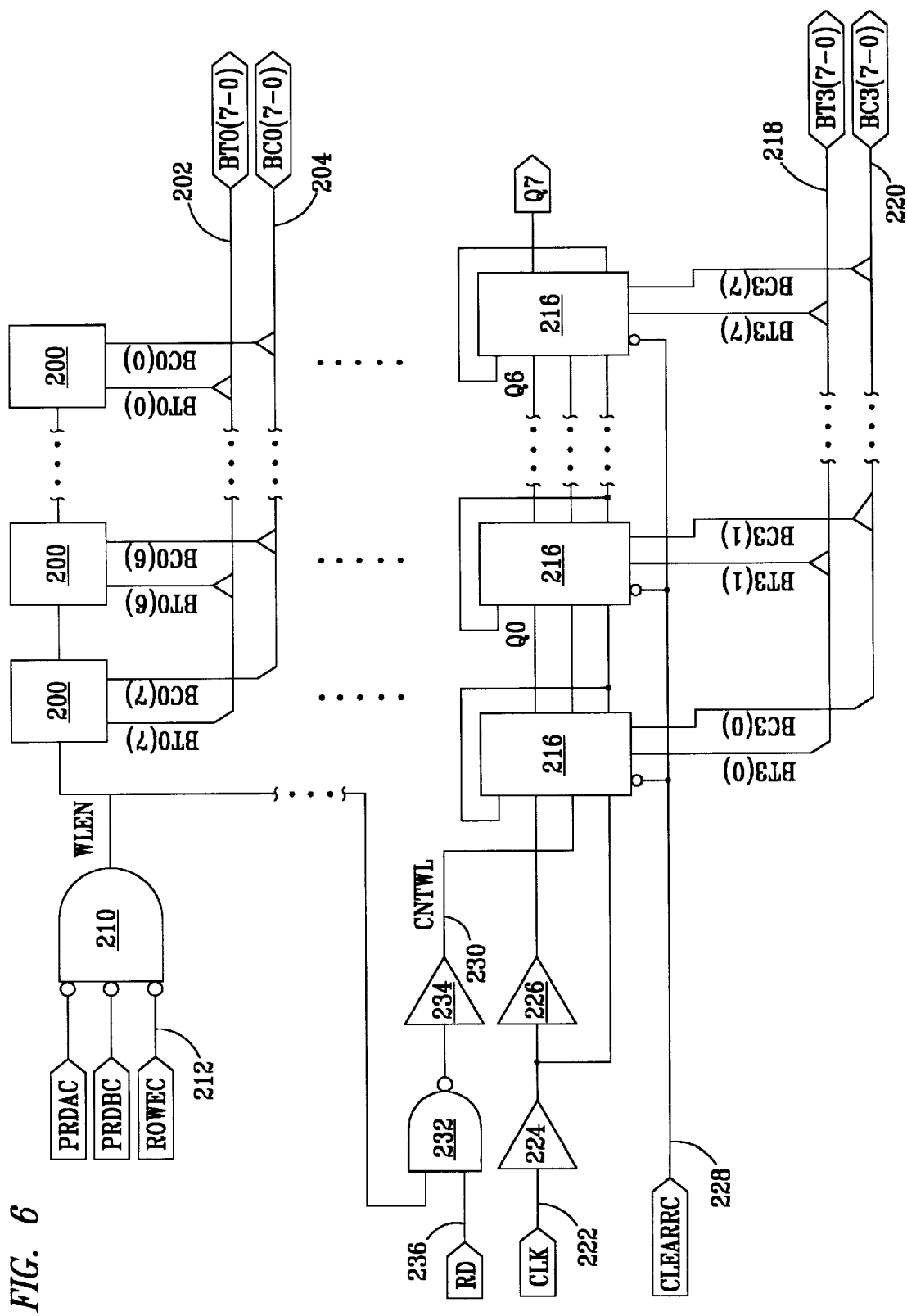
FIG. 6 illustrates a logic diagram of a portion of the memory illustrating the counter operation integrated into a single row.

Referring now to FIG. 6, there is illustrated a block diagram of two select rows in the RAM counter block 62. As described above, there are 128 bytes of data, requiring 128-bit rows in the memory, the memory being arranged in an 8-bit wide configuration. Of these, the predominant number of rows are made up of memory cells that can be accessed by the external user and written to by the external user, but not accessed internal to the monitor circuit 10. These are primarily used by the user and can be referred to sometimes as "scratch pad" memory. They can be utilized for storage of such things as serial number, battery type, etc. They are configured of standard six transistor memory cells 200, which are arranged in an 8-bit wide row. Each of the memory cells has a true and a complement data line, BT and BC, respectively. The true data lines are connected to a true data bus 202 and the complement data nodes are connected to a complement data bus 204. Each of the memory cells 200 has a word line 208 associated therewith, with all the memory cells in the given row having the same Word Line. In general, whenever the memory is accessed, all of the Word Lines for a number are activated. An external decoder will determine which of the data buses 202 and 204 for which of the rows will be accessed for a Read or Write operation. In order to Read the contents of an accessed memory cell, it is only necessary to sense the particular logic state on a given node. In order to Write to the data cell, it is only necessary to force the data nodes to a different state to upset the previously stored data.

The Word Line signal is generated by a three-input AND gate 210 with inverting nodes on the input thereof. There are two precharge signals that are input to two of the inputs, PRDAC and PRDBC. A row encode signal is received on a line 212 to selectively generate the Word Line output on line 208. Again, this Word Line 208 is connected to a number of the rows of memory cells in banks of four.

An additional row of memory cells is illustrated, a counter row. In the preferred embodiment, the counter operation is facilitated by incorporating a plurality of D-flip-flop memory cells 216 into the memory, such that for each bit in the register, there being 8-bit registers, the bit is realized with the D-flip-flop cell 216. The dual flip-flop 216 is a D-type flip-flop, which has a data input, a true output QT and a complement output QC. There is also provided a clock input with the output being read through a true output BT and a complement output BC. The true and complement outputs are connected to the true data bus 218 and the complement data bus 220, respectively. The clock signal is derived from a CLK signal on a line 222, which is buffered through two series-connected inverters 224 and 226. This allows a CLK signal to be generated on the output of the inverter 226 and the complement thereof on the output of the inverter 224. There is also provided a Clear signal on a line 228, which is operable to be input to a clear input of the cell to allow the system to clear the contents of the register or preset the contents to a known state. This is typically provided for during a power-up condition, such that the flip-flops are in a known state.

The CLK signal on the line 222 is generated separately for each of the registers utilizing the counters. For example, if the flip-flops 216 in the illustrated counter row in FIG. 6 were associated with the discharge counter for each transition of the discharge counter clock, the counter would be incremented. This configuration removes the requirement for a separate counter and latch which would then have to be loaded into a memory location. In this configuration, the memory locations themselves are the counter bits. Thus, in order to determine what the value of the counter is, it is only necessary to externally access the data buses 218 and 220 and read the contents of the counter. Since this is a selective read of that register, this operates differently from the normal register in that a separate Word Line Enable signal CNTWL is generated on a line 230 with a NAND gate 232 through an inverter 234. A RD signal on a line 236 is input to one input of the NAND gate 232. The other input thereof connected to the Word Line Enable signal 208. When both the Word Line Enable signal is present and the RD signal from line 236 is present, then the word line for each of the flip-flops 216 will be enabled. Therefore, this particular counter row is specifically Read.

Figure 7:
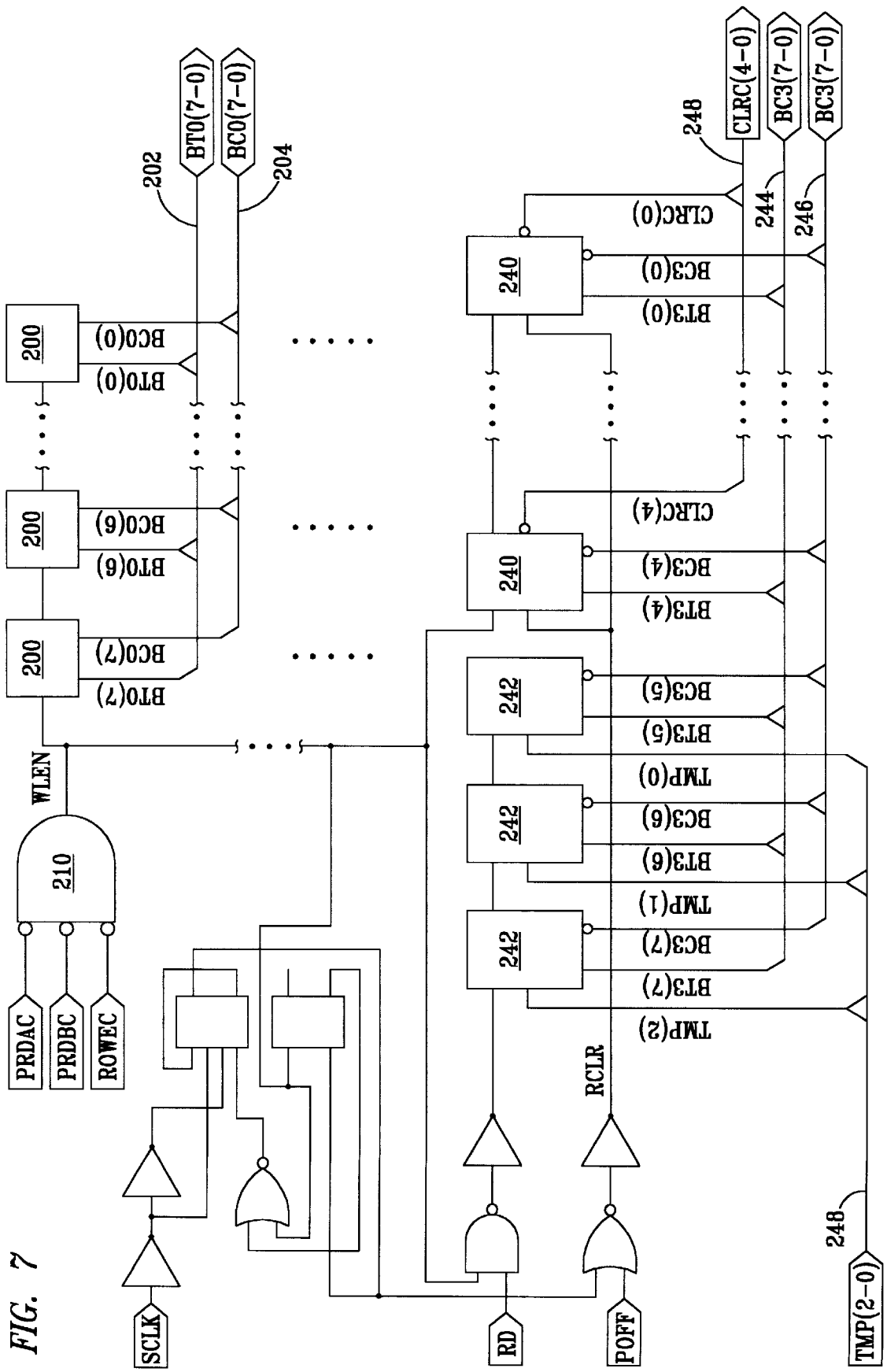
FIG. 7 illustrates a logic diagram of a portion of the memory illustrating a bi-directional data transfer row.

Referring now to FIG. 7, there is illustrated a logic diagram for a portion of the RAM and counter block 62 illustrating both a standard row of memory cells, as described with reference to FIG. 6, and an additional row of the memory cells that allow for interface with the monitor circuit 10, i.e., this allows information to be transferred from the user to the monitor circuit 10 and from the monitor circuit 10 to the user. In this illustration, the one row of registers is comprised of two types of registers, clear cell registers 240 in bits 0–4 and temperature set cells 242 in bits 5–7. Each of the temperature cells 242 has a true and complement output that is interfaced with true and complement output buses 244 and 246, respectively. Similarly, the true and complement outputs of the clear cells are interfaced with the buses 244 and 246. However, the clear cells each have a clear bit that is output on a separate bus 248. These clear bits are utilized to clear the counters 216 with the particular bit input on the associated line 228. Therefore, each of the five clear cells 240 can be associated with one of the rows of counters, such that the given clear cell 240 can clear an entire row of count registers. This allows the user to reset the value of a particular count register to "0."

The temperature set cells, in addition to having true and complement outputs connected to the buses 244 and 246, also have a TMP input connected to a TMP bus 248. The TMP cells 242 allow information to be transferred from the monitor circuit 10 to the user. Although not illustrated, there will be another set of cells that allow information to be stored in the memory cell and transferred out through a bus. This will be described with respect to the individual cell circuitry.

Figure 8:
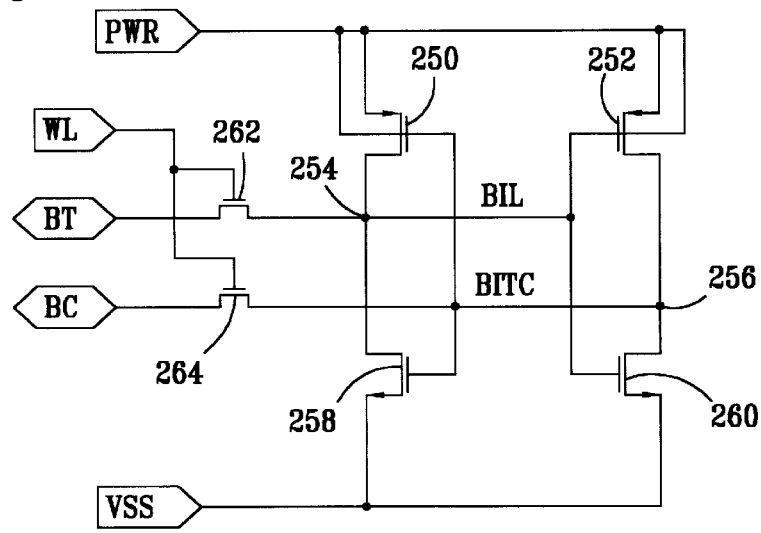
FIG. 8 illustrates a standard memory cell in the memory.

Referring now to FIG. 8, there is illustrated a conventional 6-transistor memory cell. This is comprised of two P-channel transistors 250 and 252 connected between the power supply node PWR and the data nodes 254 and 256. Two N-channel transistors 258 and 260 are connected between data nodes 254 and 256 and $V_{SS}$. The gates of the transistors 252, 258 and 260 are connected in a cross-coupled configuration. Two pass transistors 262 and 264 are connected between the true output and data node 254 and the complement node and the data node 256, respectively. Again, this is conventional for a 6-transistor cell.

Figure 9:
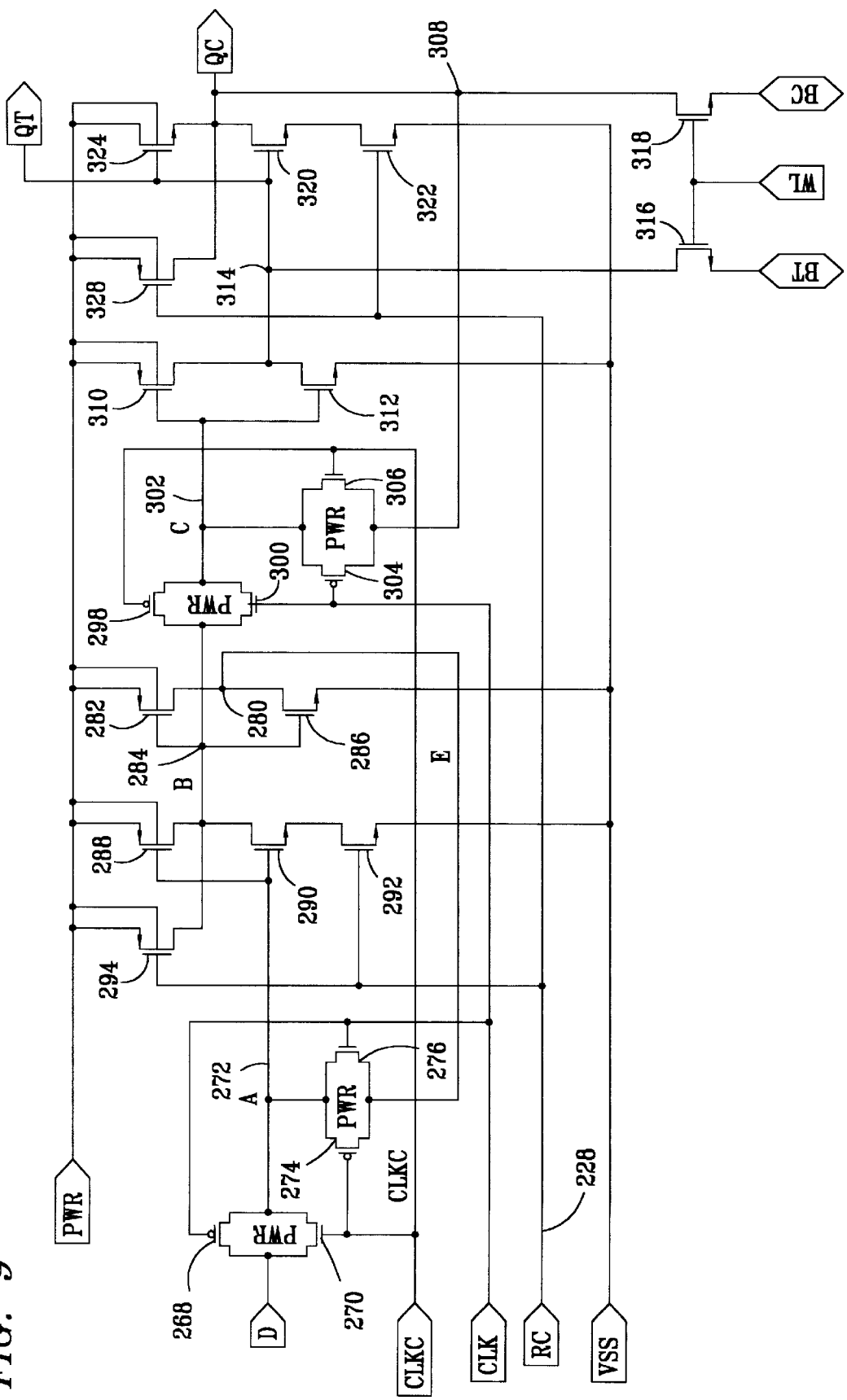
FIG. 9 illustrates one of the memory cells incorporating a flip-flop for use with the counter operation.

Referring now to FIG. 9, there is illustrated a schematic of the dual flip-flop. The data signal on the D-input thereof is connected to one side of two parallel connected transistors, P-channel transistor 268 and an N-channel transistor 270, the other side thereof connected to a node 272. The gate of transistor 270 is connected to the CLKC signal and the gate of transistor 268 is connected to the CLK signal. The node 272 is connected to one side of a gate configured of two parallel-connected transistors, a P-channel transistor 274 and an N-channel transistor 276, the gate of transistor 274 connected to the CLKC signal and the gate of transistor 276 connected to the CLK signal. The other side of the transistors 274 and 276 are connected to a node 280. Node 280 is connected to one side of the P-channel transistor 282, the other side thereof connected to the power node and the gate thereof connected to a node 284. Node 280 is also connected to one side of an N-channel transistor 286, the other side thereof connected to $V_{SS}$ and the gate thereof connected to node 284. Node 284 is connected to one side of the P-channel transistor 288, the other side thereof connected to the power supply rail and the gate thereof connected to the node 272. Node 284 is also connected to one side of two series-connected—channel transistors 290 and 292, the other side of the two series-connected transistors connected to $V_{SS}$, the gate of transistor 280 connected to node 272 and the gate of transistor 292 connected to the Clear input RC on line 228. The node 284 is also connected to one side of the P-channel transistor 294, the other side thereof connected to the power terminal and the gate thereof connected to the clear signal on line 228. Node 284 is connected to one side of a gate configured of a P-channel transistor of parallel-connected transistors, a P-channel transistor 298 and an N-channel transistor 300, the gate of transistor 298 connected to the CLKC signal and the gate of transistor 300 connected to the CLK signal. The output of the gate is connected to a node 302. Node 302 is connected to one side of a gate circuit configured of two parallel-connected transistors, a P-channel transistor 304 and an N-channel transistor 306, transistor 304 having the gate thereof connected to the CLK signal and the gate of transistor 306 connected to the CLKC signal. The other side of the pass gate circuit comprising transistors 304 and 306 is connected to the complement output on a node 308. Node 302 is connected to the gates of two transistors, a P-channel transistor 310 and an N-channel transistor 312 connected in an inverter configuration between the power terminal and $V_{SS}$, the output of the inverter configuration connected to a node 314. Node 314 is connected through a pass transistor 316 to the true data line BT and the node 308 is connected through a pass transistor 318 to the complement data line BC, the gates of transistors 316 and 318 controlled by the Word Line WL. Node 314 also comprises the true output QT. Node 314 is connected to the gate of an N-channel transistor 320, the source/drain path thereof connected between the node 308 and one side of an N-channel transistor 322. The other side of transistor 322 is connected to $V_{SS}$ and the gate thereof is connected to the Clear signal on line 228. Node 308 is also connected to one side of a P-channel transistor 324, the other side thereof connected to the power terminal and the gate thereof connected to node 314. A P-channel transistor 328 is provided having the source/drain path thereof connected between the power terminal and the QC output node 308 and the gate thereof connected to the Clear signal.

In operation, the data value is clocked through the gate comprised of transistors 268 and 270. Whenever the clock signal occurs, the data is passed through to node 272, the inverted version thereof being passed through to node 284. On the next transition in the opposite direction, the gate circuit configured of transistors 298 and 300 passes the signal through to node 302 and also feeds back the signal on node 284 in inverted form from node 280 to the node 272 through the gates comprised of transistors 274 and 276. The signal on the node 302 is inverted to node 314 to provide essentially the logic state on the input data to the QT output. This is also inverted on the QC output. In general, this is a relatively straightforward operation. The Clear operation, as described above, is determined by the signal on line 228, which is determined by the contents of the associated one of the Clear registers.

Figure 10:
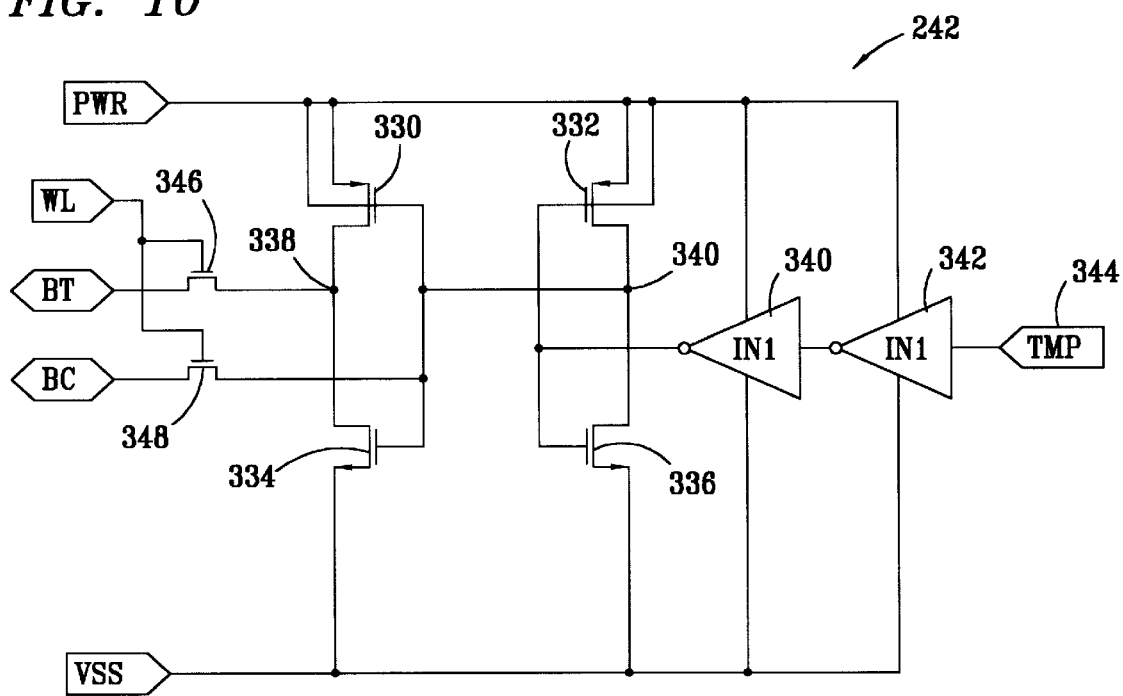
FIG. 10 illustrates a diagram of a memory cell which is operable to allow data to be stored therein from the battery charge/monitor circuit for access external thereto.

Referring now to FIG. 10, there is illustrated a schematic diagram of the temperature set cell 242. The cell 242 has series-configured P-channel transistors 332 and 336, respectively, configured in an inverter configuration with a data node 340 connected between the juncture of the two source/drain paths thereof. A series-connected P-channel and N-channel transistor 330 and 334, respectively, are connected together in an inverted configuration with data node 338 provided at the juncture between the two source/drain paths thereof. The gates of transistors 332 and 336 comprise an input which is connected to the output of two series-connected inverters 340 and 342 to a TMP input 344, which is the input to the cell 242. Node 340 is connected at the gates of transistors 330 and 334. Node 338 is connected through the pass transistor 346 to the true data terminal and data node 340 is connected through a pass transistor 348 to the complement data bus. The gates of transistors 346 and 348 are controlled by the word line input. In operation, it can be seen that the value on the TMP line 344 determines the complement value on the data node 340, which then draws the transistors 330 and 334 to invert this value. From a layout standpoint, the transistors 330–336 are identical to the layout of the remaining standard memory cells 200.

Figure 11:
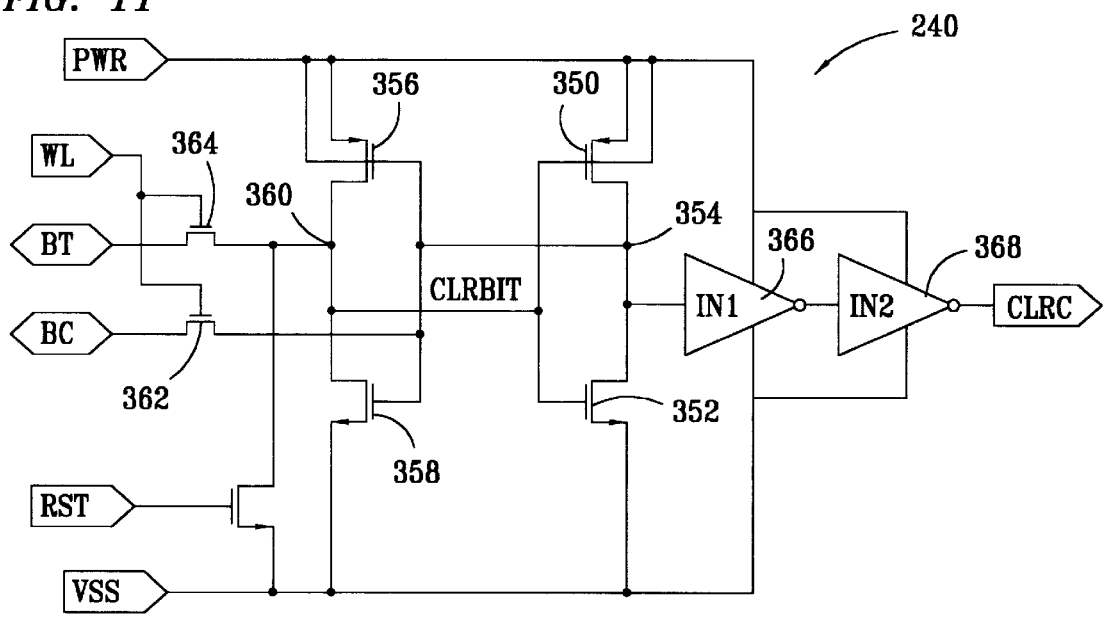
FIG. 11 illustrates a schematic diagram of a clear memory cell, which is operable to store information therein for output therefrom.
Figure 12:
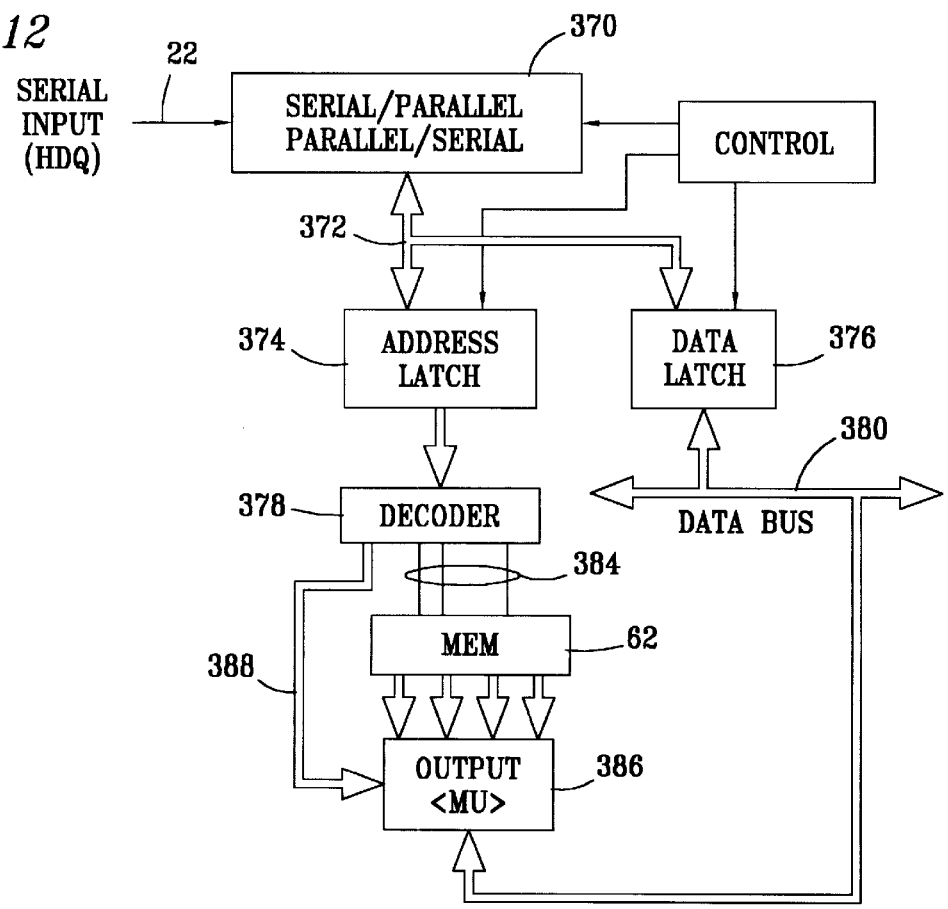
FIG. 12 illustrates a block diagram of the input/output operation.

Referring now to FIG. 11, there is illustrated a schematic of the clear memory cell 240 which, as described hereinabove, is operable to receive from the host system or CPU 24, a Clear bit that is associated with a row of counter memory cells. The memory cell is comprised of a conventional 16-memory cell, with series-connected P-channel and N-channel transistors 350 and 352, respectively, connected to a first data node 354 and second series-connected P-channel and N-channel transistors 356 and 358 associated with the data node 360. Data node 354 drives the gates of transistors 356 and 358 and is also connected through a pass transistor 362 to the complement data bus. The data node 360 drives the gates of transistors 350 and 352 and is connected through a pass transistor 364 to the true data bus. The gates of transistors 362 and 364 are connected to the Word Line. Data node 354 is connected through the input of two series-connected inverters 366 and 368 to provide the Clear output. In operation, the buffers 366 and 368 allow the data on node 354 to be output to an internal node in the monitor circuit 10. Even though this cell is associated with the Clear operation, it should be understood that this memory cell architecture can be utilized for any register bit location that is operable to receive information during a Write operation from the data bus and immediately output that information to an internal node in the monitor circuit 10 for control purposes. In FIG. 12, the serial input on the HDQ line 22 is input to a parallel/serial converter 370, which during input operations is operable to convert a serial input data stream to a parallel data stream for output on an intermediate bus 372 and, in an output operation, is operable to convert a parallel formatted signal to a serial formatted signal or data stream. When data is input, both address information and data information are input. The address information is latched into address latch 374 wherein the data is latched into a data latch 376. The address latch will then have the contents thereof decoded by decoder 378 to enable the appropriate row of data. The data latch 376 is bi-directional, such that data can be latched from the data bus into the latch 376 and then converted to a serial data stream. A control circuit controls the operation of the address latch 374, data latch 376 and the serial/parallel-parallel/ serial converter 370.

The decoder 378 is operable to enable blocks of rows in memory block 62. The blocks are arranged in four row blocks. Therefore, there are a plurality of enable lines that are output enable lines 384 that are output by the decoder 378 that are input to the memory block 62. This is essentially a single line that will decode four Word Lines. This is input to the three-input AND gate 210 as the ROWEC signal. With reference to FIG. 7, this is indicated as the Word Line Enable signal that is output on line 208 that will drive the Word Lines for four blocks. Of course, certain blocks will require an additional signal such as a Read signal RD to enable a given row which requires the AND function of both the ROWEC signal and a Read signal or some other signal.

In order to decode and select one of the rows, an output multiplexer 386 is provided which receives four bits of the decoded address on a bus 388. This will provide a data output that is then input to the data bus 380.

Figure 13:
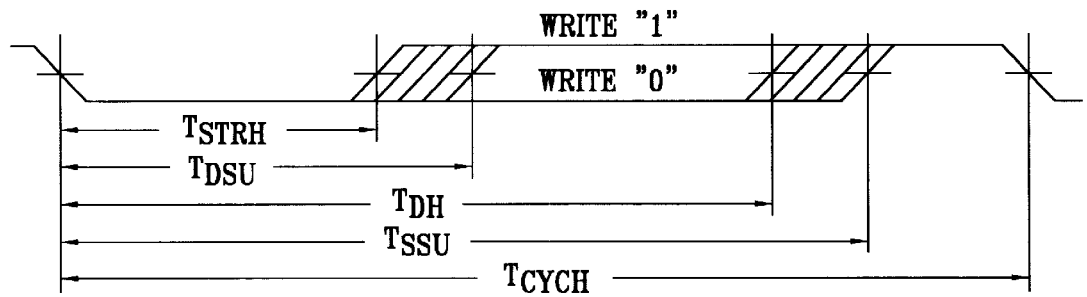
FIGS. 13–15 illustrate a timing diagram for the communications operation.
Figure 14:
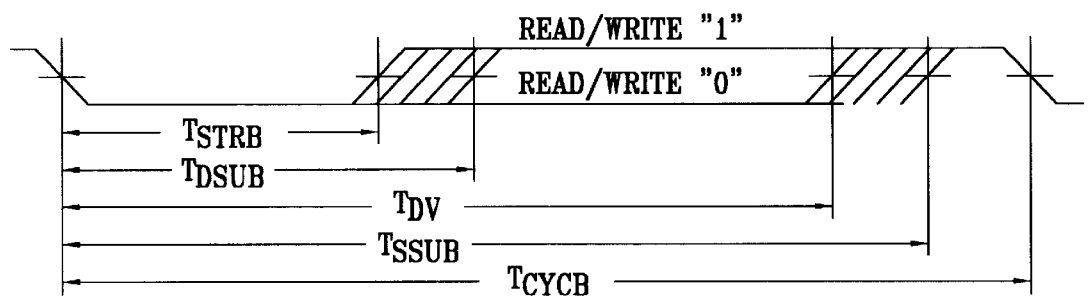
Figure 15:
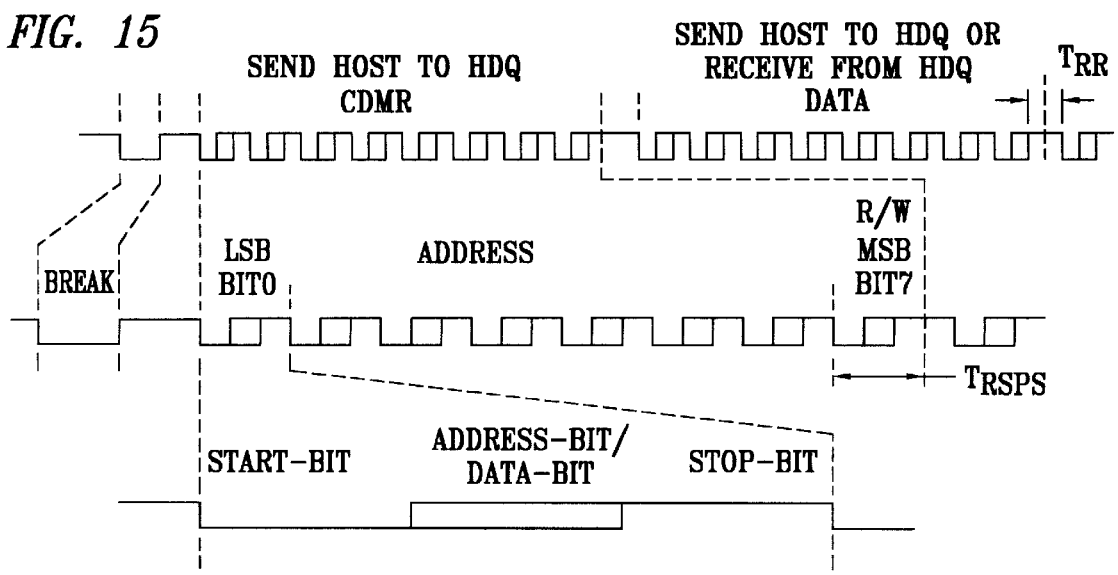

Referring now to FIGS. 13–15, there are illustrated timing diagrams illustrating the communications operation. FIG. 13 illustrates transmission from the CPU 24 to the monitor circuit 10. FIG. 14 illustrates transmission from the monitor circuit 10 to CPU 24, and FIG. 15 illustrates a communications frame example. In FIG. 13, it can be seen that, whenever the HDQ line is pulled low by the CPU, there is a predetermined amount of time wherein data can be written as a "1" or a "0." This is a given cycle for a given bit. In FIG. 14, whenever data is written from the monitor 10 to the CPU 24, the CPU 24 must go into a high impedance state and wait for a data transmission of the HDQ line, which is pulled low by monitor circuit 10 after which there is a period of time during which a Read/Write operation can occur during one cycle. Only one bit can be read or written during a cycle. In FIG. 15, there are illustrated timing diagrams for a sample transmission wherein after the BREAK period, the command signal is sent which determines whether it is a Read or a Write operation. This Read or Write operation is indicated by bit 7 with the following bits being the address. This is followed by a Write or Read operation. In a Write operation, data would be sent from the CPU 24 to the monitor circuit 10. In a Read operation, the monitor circuit 10 would control the operation and send data from the monitor circuit 10 to the CPU 24.

Figure 16A:
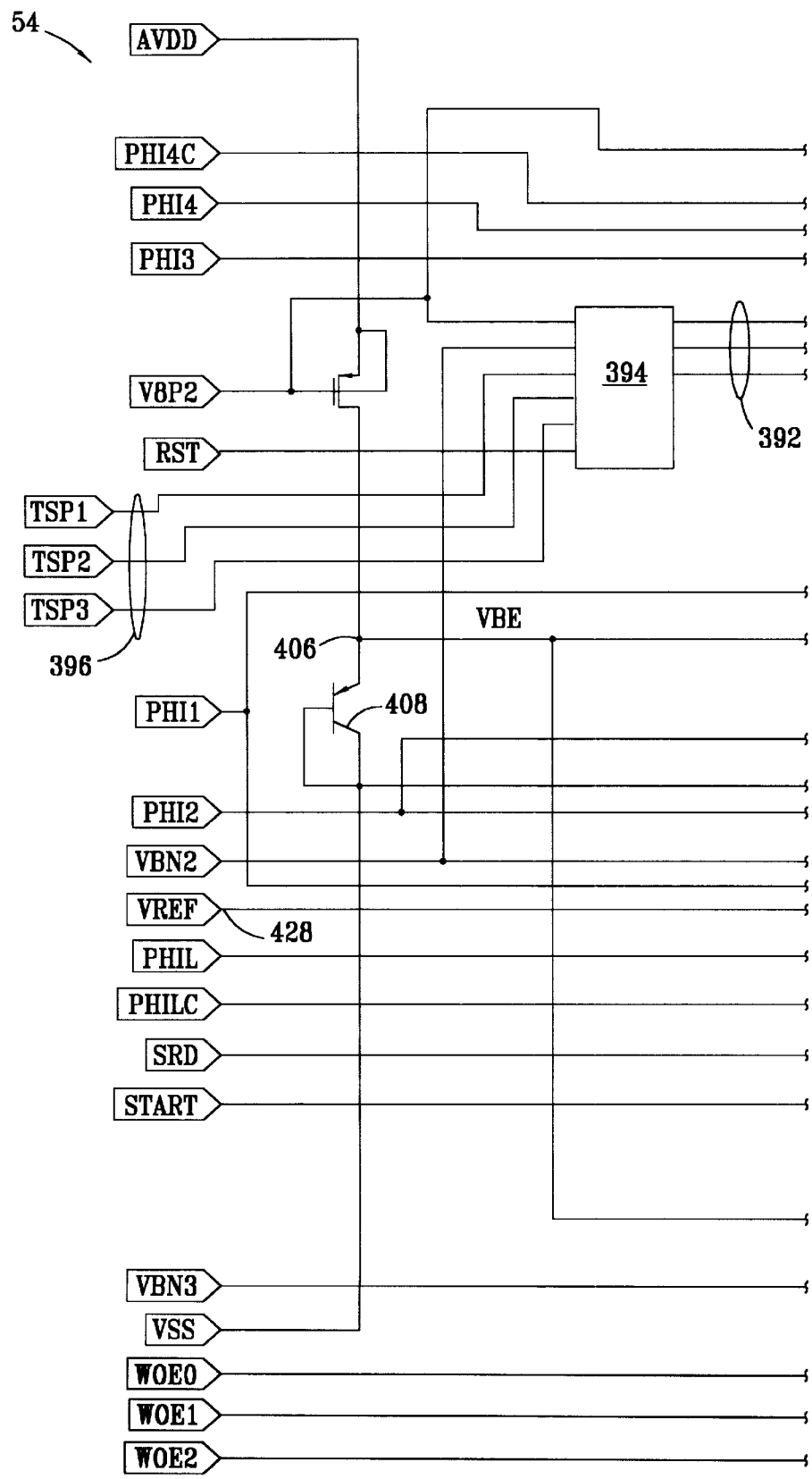
FIGS. 16a–16c illustrates a logic diagram of the temperature sensor.
Figure 16B:
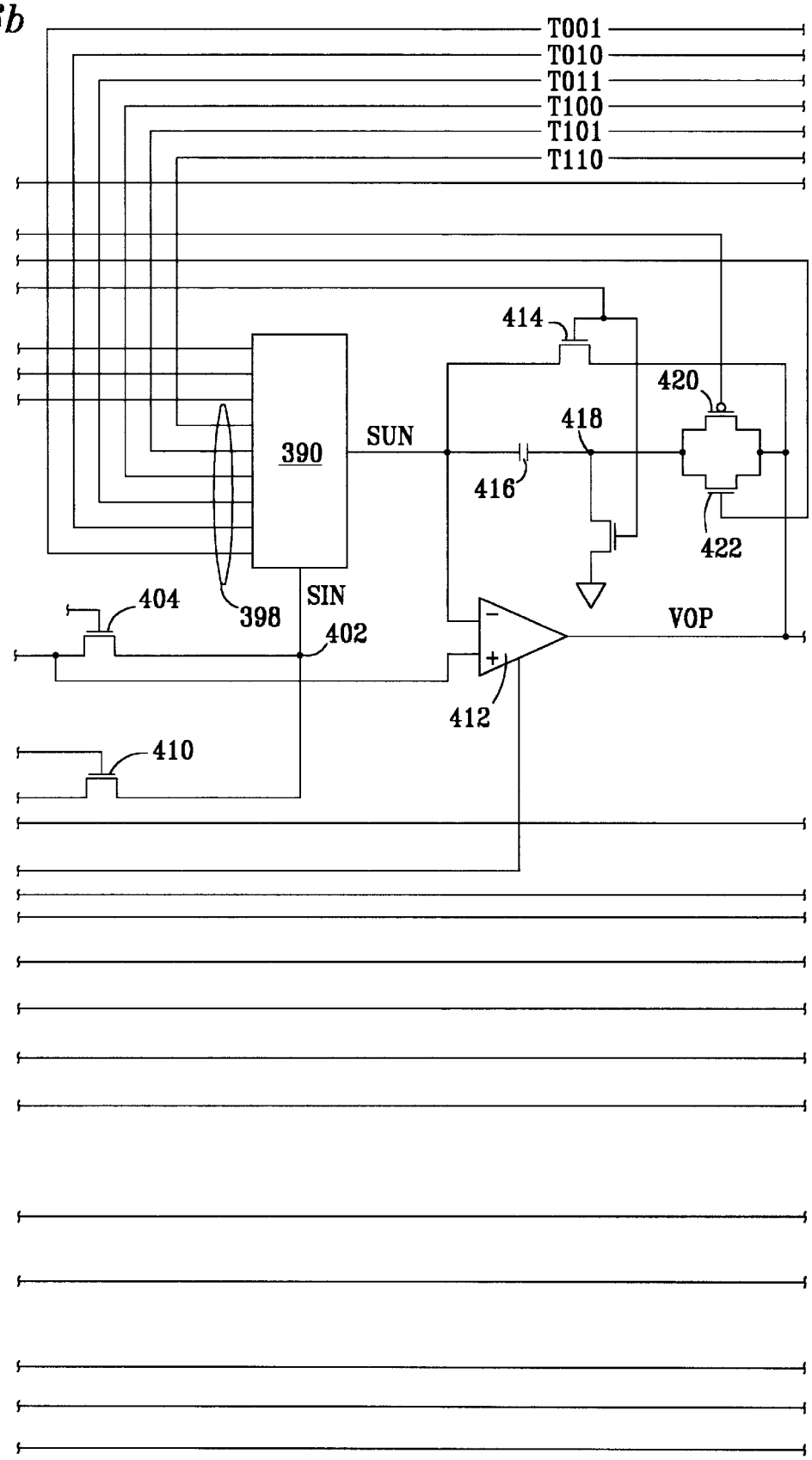
Figure 16C:
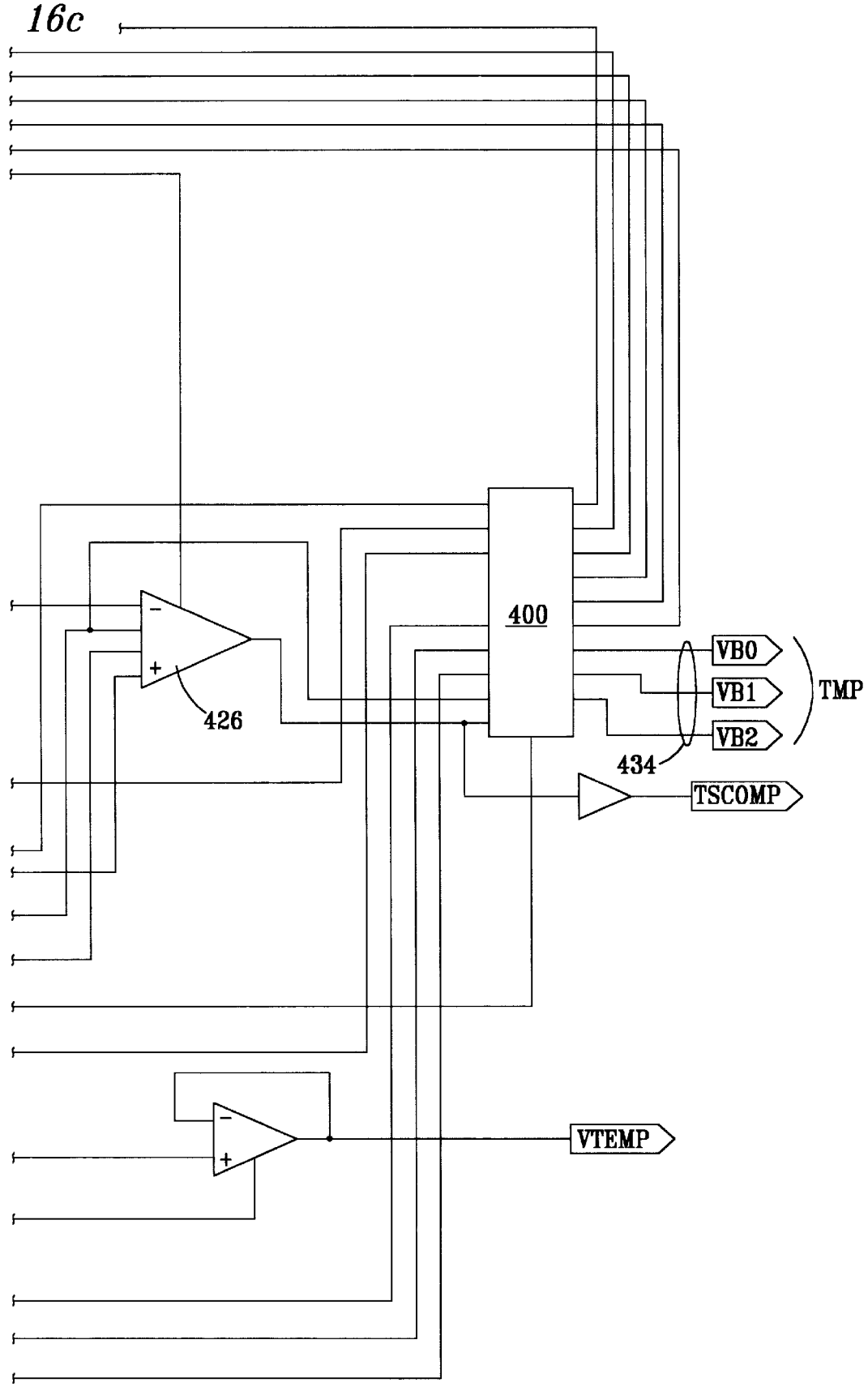

Referring now to FIGS. 16a–16c, there is illustrated a logic diagram of the temperature sensor 54. A programmable trim network 390 is provided which is operable to receive three trim inputs f1, f2 and f3 on lines 392 from a trim network 394. The outputs on lines 392 are basically derived from trimmable fuse networks. The fuse control signals are provided on three lines TSP1, TSP2 and TSP3 396. During assembly, these lines are connected to pads which can be raised high to "open" a particular fuse to change the logic state of the associated one of the lines 392. This merely provides a three-bit input to the programmable trim circuit 390. The programmable trim circuit 390 also receives counter outputs 398, which counter outputs are derived from a control circuit 400. The programmable trim circuit 390 receives a reference voltage input on a node 402 which is connected through an N-channel transistor 404 to a node 406. Node 406 is connected to the emitter of a diode-connected PNP transistor 408, the collector and base thereof connected to ground. The node 402 is also connected through an N-channel transistor 410 to ground. The gate of transistor 404 is controlled by a timing signal PHI1, this signal being a phase clock that is utilized for a switched capacitor operation. The gate of transistor 410 is controlled by a gate signal PHI2. PHI1 and PHI2 are typically 180 degrees out of phase. In this manner, the voltage on node 402 is switched between vbe and ground.

The output of the programmable trim network 390, once programmed, is then input to the negative input of an OPAMP 412, the positive input thereof connected to vbe node 406 as a reference. The OPAMP 412 is operable to provide a gain of approximately two and has an N-channel transistor 414 connected between the negative input and output with the gate thereof connected to a timing control signal PHI3. A switched capacitor 416 is connected between the negative input and a node 418, node 418 connected through a gate configured of a P-channel transistor 420 and an N-channel transistor 422 to the output of the OPAMP 412, the gate of P-channel transistor 420 connected to timing signal PHI4C (complimentary) and the gate of transistor 422 connected to the PHI4 timing signal. PHI1, PHI2, PHI3 and PHI4 are all conventional timing signals for a switched capacitor operation. Therefore, the OPAMP 412 is a switched capacitor that works in conjunction with the temperature sensing network 390 to provide a switched capacitor circuit output on the output of OPAMP 412.

The output of OPAMP 412 is input to the negative input of a comparator 426, the positive input thereof connected to a voltage $V_{ref}$ on a line 42. The comparator 426 is operable during the programmable trim operation to compare the output of the OPAMP 412 with the reference voltage 428 generated by the bandgap generator 50. Whenever the output goes above the reference voltage, the output of the comparator 426 changes state, which change is input to the VCO input of the control circuit 400. The control circuit 400 is operable to generate the count values on the lines 398 and then internally initiate a three-bit counter, the output of which comprises a decoded output on lines 398. The count values goes from zero upwards from "001 to 110" and the three-bit counter is output on three lines 434 labeled VB0, VB1 and VB2, these being the 3-bit temperature value. The count value will be incremented upwards until the output of the OPAMP 412 rises to a point equal to $V_{ref}$, at which time the output of the comparator 426 toggles and latches the data into an internal latch in the control circuit 400, which latched output then comprises the value on the lines 434.

Figure 17:
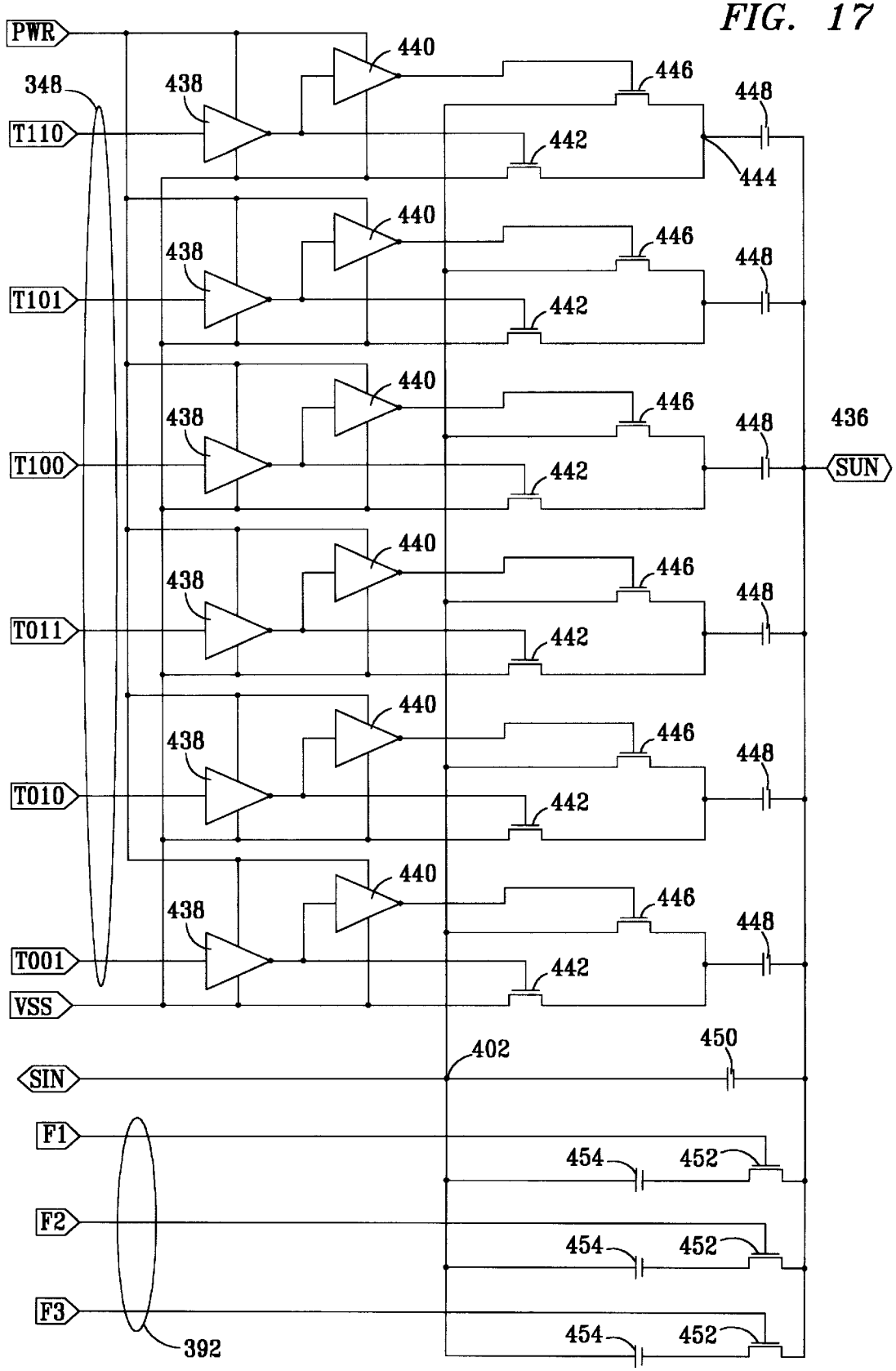
FIG. 17 illustrates a schematic diagram of the programmable trim circuit.

Referring now to FIG. 17, there is illustrated a logic diagram of the programmable trim circuit 390. The programmable trim circuit 390 is comprised of a plurality of capacitors which are switched between an output node 436 and either ground or the node 402. Each of the lines 398 is connected to the input of an inverter 438, the output thereof connected to a node 440. The output of inverter 438 is connected to the gate of a transistor 442, the source/drain path thereof connected between ground and a node 444. The output of inverter 440 is connected to the gate of a transistor 446, the source/drain path thereof connected between node 402 and the node 444. Each of the nodes 444 for each of the input lines 398 is connected to one side of an associated capacitor 448, the other side thereof connected to the node 436. Therefore, the transistors 442 and 446 are operable to switch between ground and the voltage on node 402, depending upon a logic state of the associated input. The voltage on node 402 is derived through a trim network. The node 402 is connected to one side of a capacitor 450, the other side thereof connected to the node 436. Each of the trim inputs on line 392 labeled f1, f2 and f3 are connected to the gate of an associated transistor 452. The source/drain path of each of the transistors 452 are connected between the node 436 and one side of an associated capacitor 454. The other side of each of the capacitors 454 is connected to the node 402. Basically, the transistors 452 allow the logic states on the lines 392 to selectively place in parallel with capacitor 451 one or more of the capacitors 454, these being sized to provide the appropriate trim. As noted above, this is performed in the assembly process.

In operation, the three-bit counter in the control circuit 400 is initiated at a value of zero and then toggled through its count values. This will result in the input T001 going high and then a comparison made with that value on the output of node 436. T001 will then go low and T010 will go high. This will continue until the pad T110 goes high, it being noted that only one of the decoded lines 398 is high at any one time. Whenever the output of OPAMP 412 rises to a point equal to $V_{ref}$, this will cause the control circuit 400 to latch the count value out of the internal three-bit counter in the control circuit 400 on to lines 434. This count value is the count value of one of the lines 398.

Figure 18:
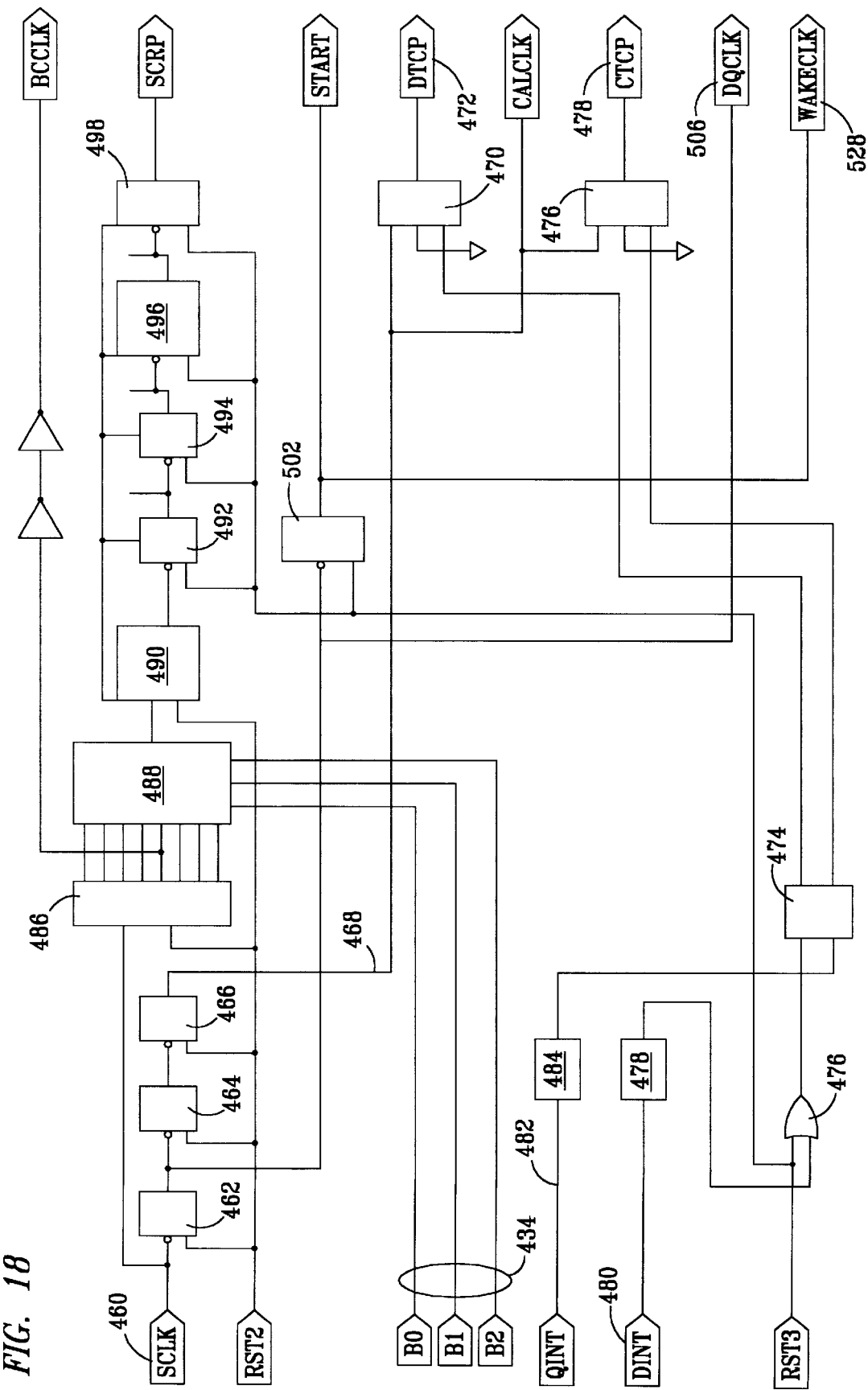
FIG. 18 illustrates a schematic diagram of the timer 60.

Referring now to FIG. 18, there is illustrated a logic diagram of the timer block 60. The timer block 60 is operable to generate a plurality of clocks from an internal clock (not shown) which signal is received on an input 460. This clock signal is passed through three divide circuits 462, 464 and 466 to divide-by-ten, divide-by-three and divide-by-three, respectively. This provides a divided clock output on a line 468. This is input to one input of a multiplexer 470, the other input thereof connected to ground. The output of the multiplexer 470 provides the discharge count clock on a line 472. The multiplexer enable input is connected to the Q-output of a set/reset latch 474 which is operable to select either the clock or ground. In this manner, the discharge timer clock on line 472 will either be clocked at one count for every 0.8789 seconds or it will not be clocked at all, as it will be connected to ground or to a logic "low." The set input of latch 474 is connected to the output of an OR gate 476, one input thereof connected to a reset input RST3 and the other input thereof connected to the output of a pulse circuit 478. The input of the pulse circuit 478 is connected to the DINT interrupt signal on a line 480 which is output by the voltage-to-frequency converter 40. This indicates that a count value has been seen. This essentially represents activity which will start the count clock. The QINT input on a line 482 is input to a pulse circuit 484, the output thereof providing the reset input to the latch 474. Therefore, whenever there is any charging activity output by the voltage-to-frequency converter 40, this will cause the latch 474 to be reset which will pull the enable line on multiplexer 470 low which will cause the ground input to be selected, thus stopping the activity on the discharge timer clock on line 472.

The clock on line 460 is also input to a divide-by-256 circuit 486, the output thereof selected by multiplexer 488 for input to a divide-by-eight circuit 490. The control input to the multiplexer 488 is the VB0, VB1 and VB2 temperature outputs on lines 434 indicating a temperature compensation operation. This basically selects one of the clock outputs from the divide-by-256 circuit 486 which is then again divided by a factor of eight with the divide-by-eight circuit 490. This output is an input to a series of divide-by circuits 492, 494, 496 and 498 to provide a divide-by-ten, divide-by-nine, divide-by-eight and divide-by-two operation, respectively. The divide-by-two circuit 498 provides on the output thereof the SCRP clock which is a self-discharge counter. This clock is clocked one count for each hour at a 25° C. ambient temperature. Of course, if the temperature varies, the temperature sensor block 54 will again provide the temperature compensating operation and regenerate the temperature values by cycling through the temperature trim circuit 390.

The output of the divide-by-ten circuit 462 which divides the input clock signal line 460 by a factor of ten is input to a divide-by-two circuit 502, the output thereof providing a start clock signal which occurs every 3.51 seconds. This also is the output of the divide circuit 502 which provides the WAKE clock WAKECLK signal at a frequency of 5.12 Hz. The output of the divide-by-ten circuit 462 also provides the DQCLK signal at a rate of 10.24 Hz. The output of the divide-by-three circuit 468 provides the CALCLK signal which is the calibration clock signal that is utilized for initiation of the calibration operation. This operates at a frequency of 1.1378 Hz or one count for every 0.8789 seconds. The clock signal on line 468 is also input to one input of a multiplexer 476, the other input thereof connected to ground and the enable input thereof connected to the Q-Bar output of latch 474. Therefore, whenever the multiplexer 470 selects the A-input which is the divided clock output on line 468, the output of multiplexer 470, which is the charge time counter on line 478, is at ground. Whenever the A-input receiving line 468 is selected by the multiplexer 476 to provide the clock output on the charge time count output 478, the discharge time counter output on line 472 is connected to ground. Therefore, the discharge time counter and the charge time counter will be mutually exclusive of each other, as determined by the set/reset latch 474.

Figure 19:
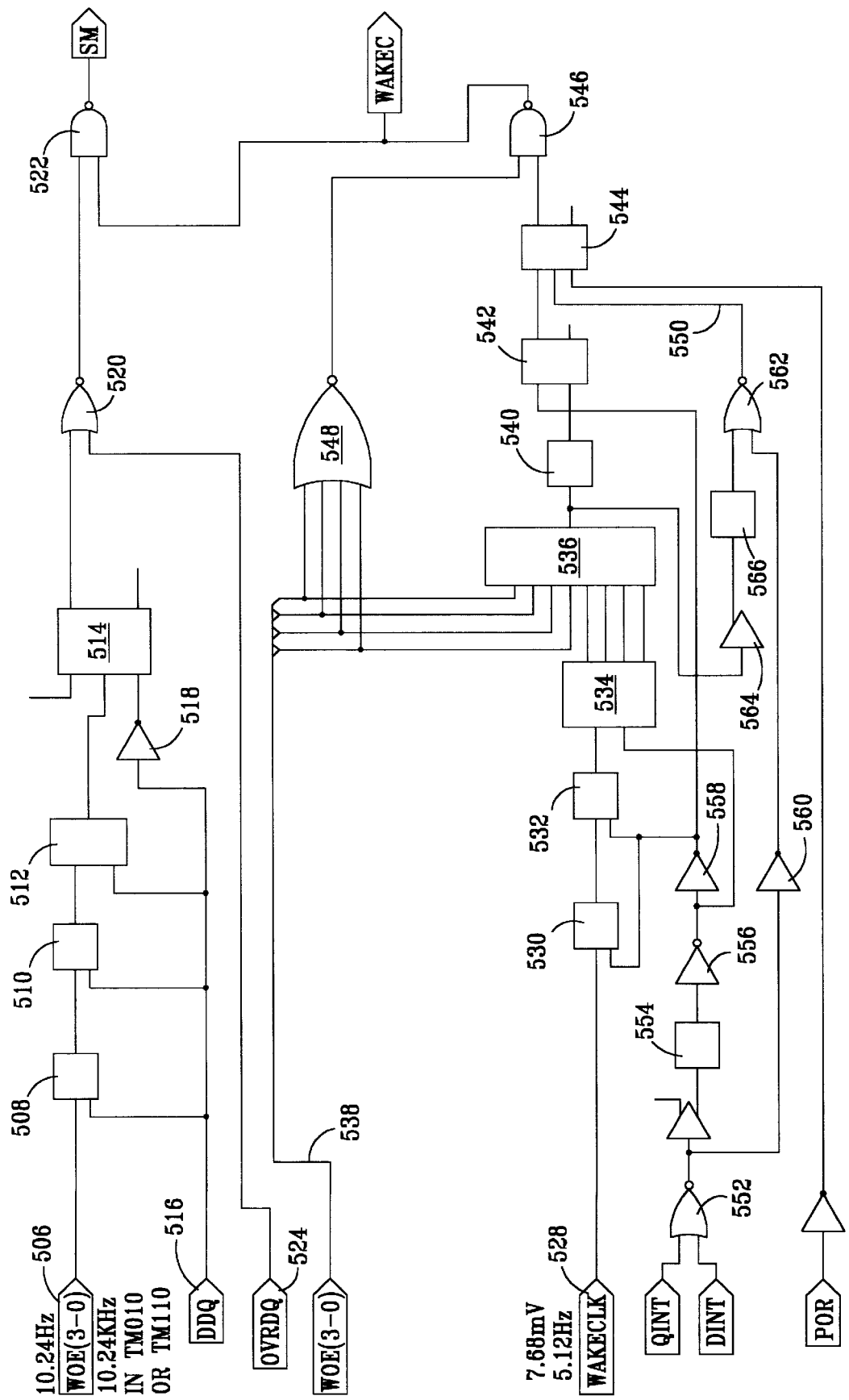
FIG. 19 illustrates a logic diagram of the power control portion of the block 46.

Referring now to FIG. 19, there is illustrated a logic diagram of the power mode operation. The power controller portion of the system is operable to basically generate a Sleep Mode signal SM or the activity signal WAKEC. The activity signal is basically a signal that indicates to the CPU 24 that there is some activity, i.e., there is some charge or discharge that exceeds the Wake-Up Output Enable threshold. For the Sleep Mode signal, the DQCLK signal on a line 506 is input to a series of divide circuits 508, 510 and 512 to divide the input signal at 10.24 Hz by a factor of ten, ten and two, respectively. This is then output to a D-type flip-flop 514 on the clock input thereof. The D-input of flip-flop 514 connected to a positive supply. The reset input of the flip-flop 514 is connected to a delayed DQ signal which basically is the input line 22 delayed by a predetermined value. This delayed DQ input is provided on a line 516 and is operable to reset the divide-by circuits 508–512 and is operable through an inverter 518 to be input to the reset input of flip-flop 514. Therefore, whenever any activity is present in the form of the DQ input being pulled low, this will remove the reset and allow the DQCLK line 506 to be divided by the divide-by circuits 508–512 and then clock the output of flip-flop 514. The flip-flop 514 will be clocked after approximately ten seconds, or specifically 9.765 seconds. When the output of flip-flop 514 goes high, it drives one input of an OR gate 520 high which then drives one input of an AND gate 522 high. The other input of the AND gate 522 is connected to the WAKEC output which indicates activity. The other input of the OR gate 520 is connected to an override input OVRDQ on a line 524 which basically allows the ten second delay provided by flip-flop 514 to be overridden. Therefore, if the OVRDQ signal is high, then any time there is no activity on the DQ line, i.e., it is pulled low, then the Sleep Mode signal will be generated. Of course, it is understood that the DDQ signal on line 516 is a delayed output such that the output would have to be pulled low for a short period of time in order to allow the override operation to go forward. Therefore, if the OVRDQ signal is high, then anytime there is no activity on the sense resistor, i.e., the input signal is below $V_{WOE}$, then the Sleep Mode signal SM will be generated.

The WAKECLK timing signal output by the timer 60 is input on a line 528 to a series of divide-by circuits, a divide-by-three circuit 530 and a divide-by-ten circuit 532. The output of the divide-by-ten circuit 532 is then input to the clock input of an up counter 534 which has a four-bit output input to a four-bit digital input of a comparator 536. The reference input is a four-bit input and is connected to the Wake-Up Output Enable signals on a bus 538. Therefore, the value of the up counter is compared to the threshold value that is input by the user and, when the count value provided by the counter 534 is equal to the Wake-Up Output Enable threshold, then the output of the comparator 536 will go high. This is input to a pulse circuit 540 to output a pulse to the reset input of a set/reset latch 542. The Q-output of latch 542 is input to the B-input of a flip-flop 544 and a Q-output being deemed the WAKE signal which is input to one input of a NAND gate 546. The other input of the NAND gate 546 is connected to the output of a four-input OR gate 548, the inputs thereof connected to the bus 538. Therefore, when the value on the bus 538 is "0000", then the output of OR gate 548 will be low, thus forcing the output of NAND gate 546 high. Whenever any of the bits of the Wake-Up Output are high, then the output of OR gate 548 will be high and the output of flip-flop 544 will control the logic state of NAND gate 546. When latch 542 is reset, the output thereof will go low and when the flip-flop 544 is thereafter clocked by the latch signal on a line 550, the WAKE signal will go low and the output of NAND gate 546 will go high. Therefore, the WAKEC output of NAND gate 546 is normally low until the WAKE signal is pulled low.

The control for the counter 534 and the flip-flop 544 is provided by determining whether either of the QINT or DINT signals shows any activity. Both of these signals are input to a NOR gate 552, the output thereof connected through an inverter to a pulse circuit 554, the output thereof input through an inverter 556 to provide the reset input on the up counter 534. The output of inverter 556 provides the reset inputs to the divide-by circuits 530 and 532 through an inverter 558 and also the set input to the latch 542. The output of NOR gate 552 is input through an inverter 560 to one input of an OR gate 562, the output thereof providing the latch input on line 552 to flip-flop 544. The comparator output 536 is input through a buffer 564 to a pulse circuit 566 to generate a pulse on the edge of the signal output by buffer 564 and this pulse is input to the other input of the OR gate 562. Therefore, whenever a change in the output of comparator 536 occurs or there is activity on either the QINT or DINT input, the output of NOR gate 552 will go low, driving the output of OR gate 562 low. Inactivity will cause the signal on latch node 550 to go high, clocking flip-flop 544. During initial inactivity, a logic "0" on both inputs of NOR gate 552 will allow the counter 534 to count. At the end of its count, i.e., when the count value of counter 534 equals the threshold value on bus 538, the output of counter 536 will go high, which will generate a pulse on the other input of the OR gate 562 and will raise the latch output 550 high. Therefore, the delay for Wake-Up Output Enable is a programmable function.

Figure 20:
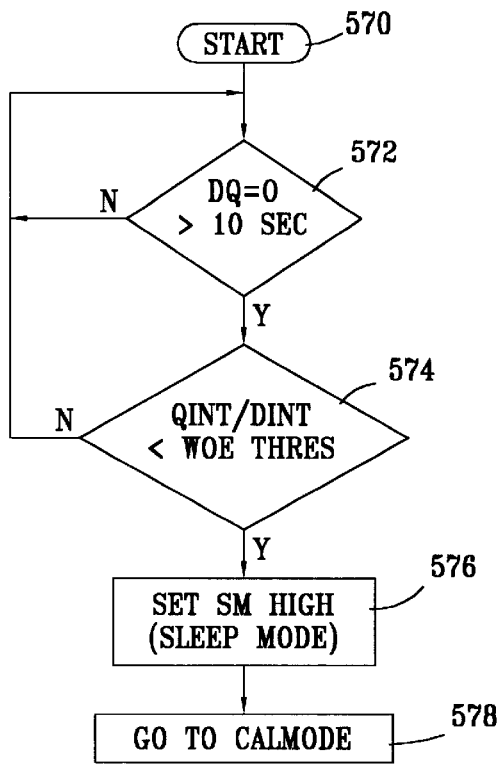
FIGS. 20 and 21 illustrate flowcharts for the power control mode of operation and the calibration mode operation.

Referring now to FIG. 20, there is illustrated a flowchart for the power control operation. The program is initiated at a block 570 and then proceeds to a decision block 572 to determine if the logic state on the DQ line has been pulled low for greater than ten seconds. If not, the program will continue in a backwards loop. If yes, the program will flow to a decision block 574 to determine if the activity on the charge and discharge nodes QINT and DINT is less than the Wake-Up Output Enable threshold. If no, then the program will loop back to the input. However, if this activity is low, less than the WOE threshold, then the program will flow along the "Y" path to a function block 576 to set the SM output high (Sleep Mode). The program will then flow to a function block 578 to then go to the Calibration Mode.

Figure 21:
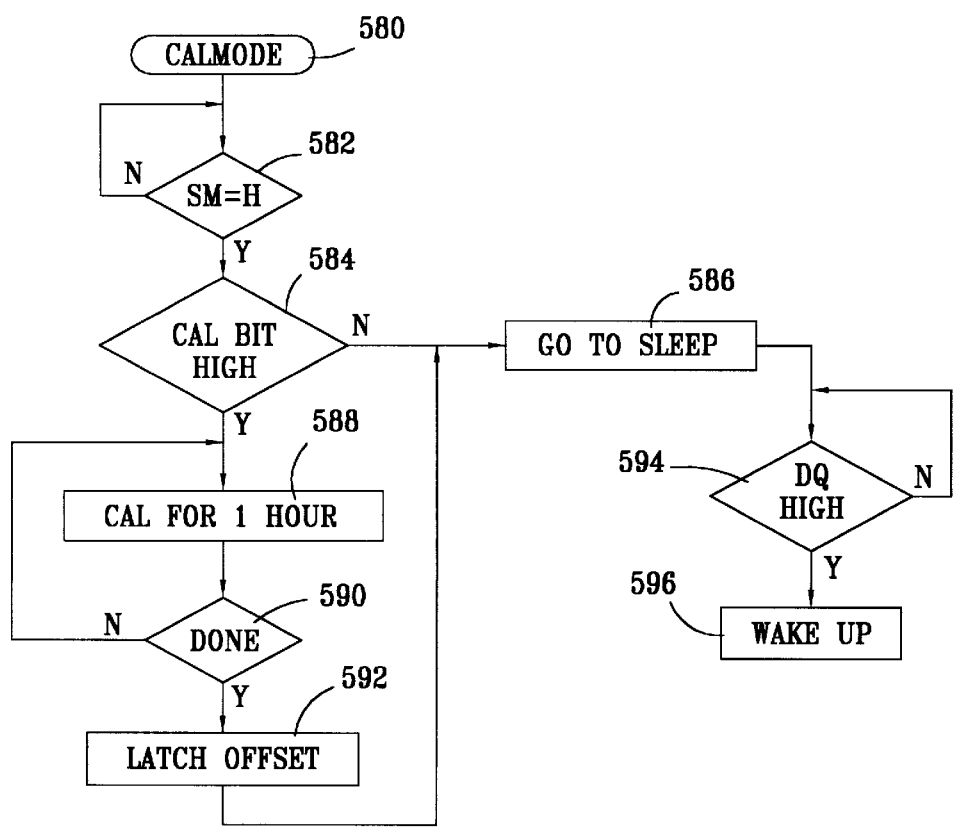

Referring now to FIG. 21, there is illustrated a flowchart for the Calibration Mode operation. The program is initiated at a block 580 which is the point that the flowchart of FIG. 20 enters the flowchart of FIG. 21. The program then flows to a decision block 582 to determine if the value of the SM bit is high. If not, the program will loop back around to the input and, if yes, the program will flow to a decision block 584. The decision block 584 determines if the user has set the calibration bit (CAL) high. If not, the program will immediately go to a sleep function block 586. If yes, the program will then flow to a function block 588 to perform a calibration operation for one hour. The program will flow to a function block 590 to determine if the operation is done. If not, the program will flow back to the input of function block 588. When completed, the program will flow along the "Y" path from decision block 590 to a function block 592 wherein the offset value will then be latched into the offset register OFR. The program will then flow to the input of function block 586 to put the integrated circuit to sleep. Once in a Sleep Mode, the program will flow to a decision block 594 to determine if the value of BQ has been pulled high. If so, the program will flow along the "Y" path to a block 596 to wake up the part. If not, the program will wait for the BQ pin to be pulled high. Therefore, it can be seen that the user controls the Sleep Mode operation by pulling the pin low for greater than ten seconds. At this point, the program will then go into a Sleep Mode and initiate the calibration mode operation. Of course, there must be no charge or discharge activity during this time. Discharge or charge activity will bypass the operation of the system and cause it to stay in an active mode to ensure that the counters are properly set.

Figure 22:
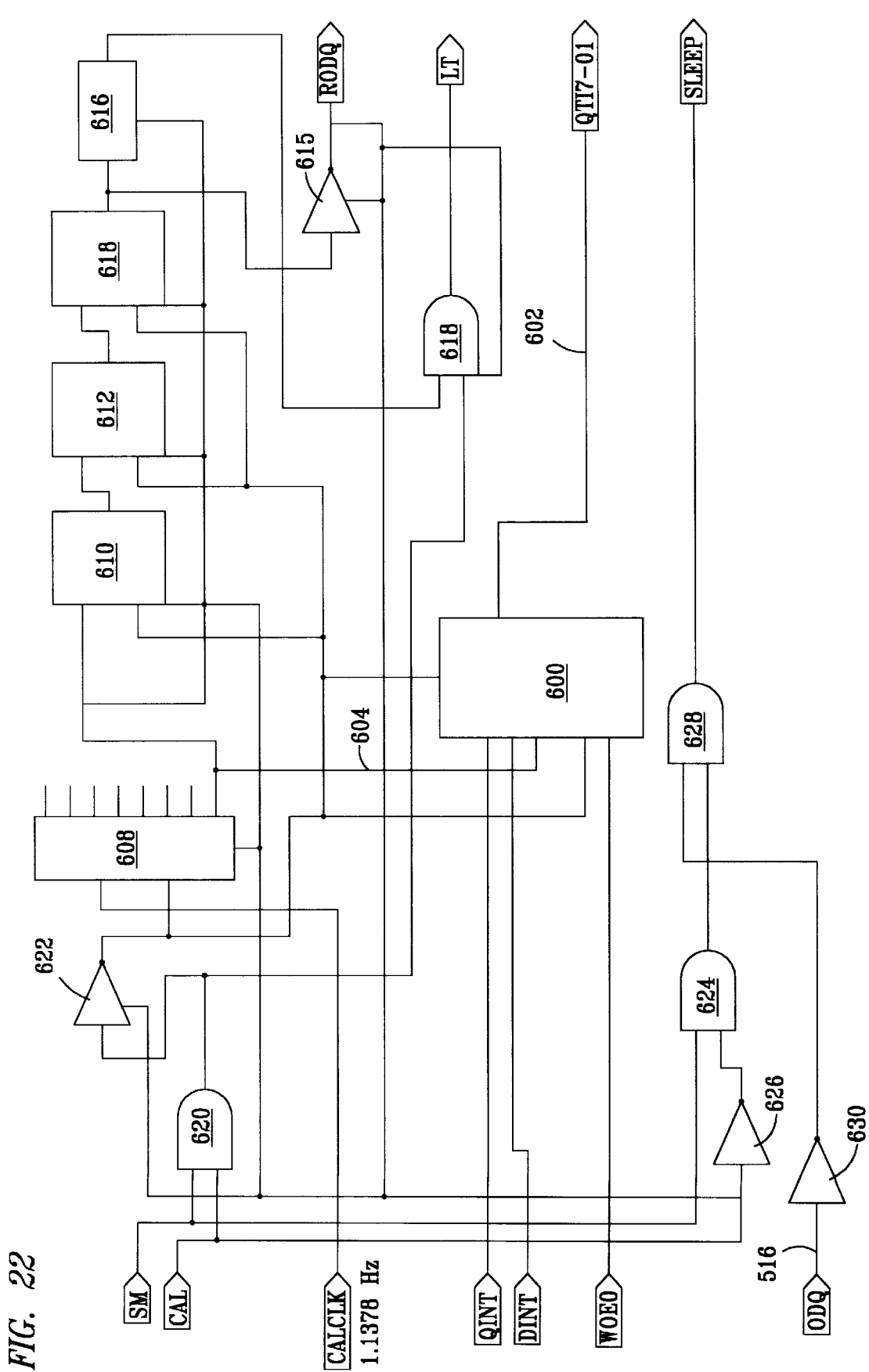
FIG. 22 illustrates a logic diagram for the calibration portion.

An up/down counter 600 in FIG. 22 is provided which is counted in one direction by the QINT input and in the other direction by the DINT input. Therefore, whenever the system is charging, the counter will charge up and whenever the counter is discharging, the counter will count down, thus providing an accumulated difference value. The counter will then provide an eight-bit count output on a bus 602. The output of the counter 600 is latched by a latch signal on a line 604 which is output by a divide-by-256 circuit 606. The divide-by-256 circuit 606 is clocked by the calibration clock CALCK signal at a rate of 1.1387 Hz. The output of the divide circuit 606 is then input to a divide-by-eight circuit 610, the output thereof then input through two divide-by-two circuits 612 and 614 for input to a pulse circuit 616 to provide a single pulse output which is then input to one input of an AND gate 618, the other input thereof connected to the output of an AND gate 620. The output of flip-flop 614 is input through a buffer 615 to provide an RODQ clock output. The signal output by 618 is the AND gate 618 is operable to provide a latch signal LT that is operable to latch the value on bus 602 in the appropriate cells. This, as noted above, is generated whenever CAL and SM are high and the calibration clock has essentially counted a duration of time of one hour.

AND gate 620 is operable to be connected to both the SM signal and the CAL signal. Therefore, if the calibration operation has been indicated and the Sleep Mode has been entered, as indicated by the Power Mode circuit of FIG. 19, then the output of the AND gate 620 will be high and the output of AND gate 618 will then be pulsed high whenever the output of the pulse circuit 616 is high. The AND gate 620 also generates the Reset input for the divide circuit 606 through an inverter 622. Therefore, whenever SM and CAL are high, the Reset signal RST will be pulled low. This reset signal also goes to the calibration counter 600. The Reset signal also is input to the divide circuit 610 and the divide circuits 612 and 614. The SM and CAL signals are also input to two inputs of an AND gate 624, the SM input directly to one input of the AND gate 624 and the CAL signal input through an inverter 626 to the other input of the AND gate 624. The output of AND gate 624 is input to one input of an AND gate 628. The other input of AND gate 628 is connected to the DDQ input on line 516 which is inverted by an inverter 630. The output of AND gate 628 provides a Sleep signal indicating the Sleep operation is to be performed. Therefore, whenever the SM signal is high and the CAL signal is low and DDQ is low, then the sleep signal will be generated.

Figure 23:
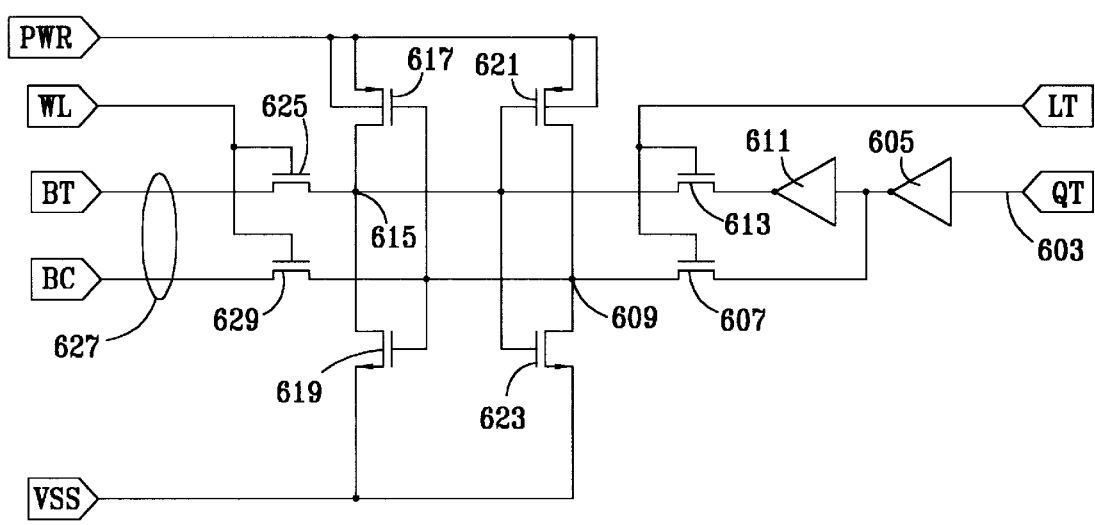
FIG. 23 illustrates a schematic diagram of a latch cell for latching the offset output into the offset register.

Referring now to FIG. 23, there is illustrated a schematic diagram of a memory cell for storing the contents of the calibration counter 600 on the bus 602. Each of the cells has associated therewith one bit on the bus 602 labeled QT. This is input on the line 603 to the cell. Line 603 provides the input for an inverter 605, the output thereof input through a latch transistor 607 to a data node 609. The output of inverter 605 is connected to the input of an inverter 611, the output thereof connected through a latch transistor 613 to a second data node 615. The latch transistor 607 and 613 have the gates thereof connected to the latch signal LT. The data nodes 609 and 615 are part of a cross-coupled six-transistor cell. This is comprised of a series connected P-channel transistor 617 and an N-channel transistor 619 between a power supply node and ground associated with node 615 with the gates thereof connected together and to data node 609. A second set of series connected transistors, a P-channel transistor 621 and an N-channel transistor 623 connected between the power supply node and ground having the gates thereof connected to the data node 615 and the common source/drain connection connected to data node 609. A latch transistor 625 is connected between data node 615 and to one of two data lines 627. The other of the data line 627 is connected through a latch 629 to the data node 609, the gates of latch transistors 625 and 629 controlled by the Word Line input. Therefore, it can be seen that a count value can be latched into a memory cell location for later reading by the user through addressing and activation of that particular cell.

Figure 24:
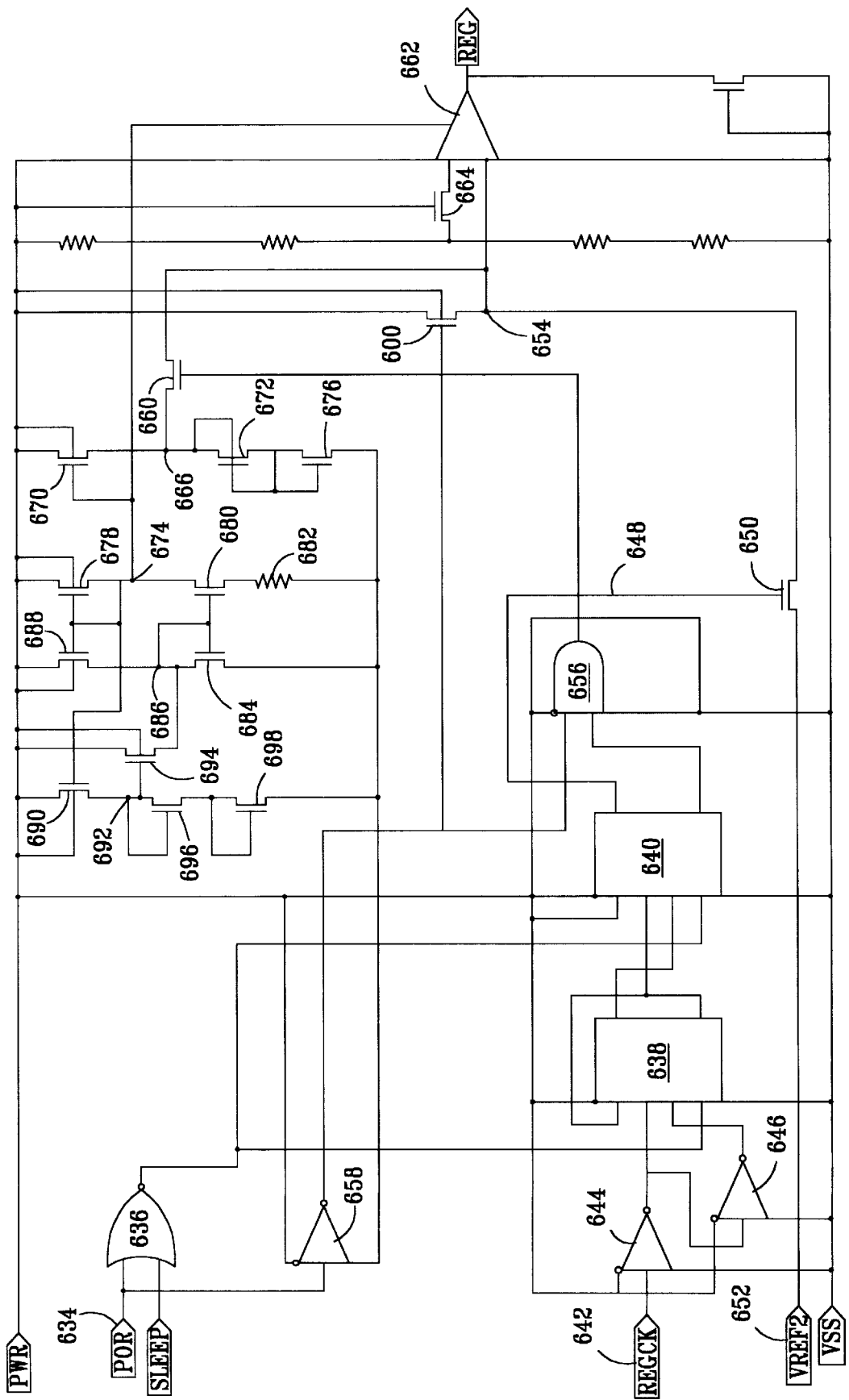
FIG. 24 illustrates a logic diagram for the regulator control.

Referring now to FIG. 24, there is illustrated a logic diagram for the regulator operation which is associated with the OPAMP 74 in FIG. 2. A Power Up Reset signal POR is received on an input line 634 to one input of a NOR gate 636. The other input thereof is connected to the Sleep signal. The output of the NOR gate 636 is connected to the reset input of two series connected flip-flops 638 and 640, respectively. The flip-flops 638 and 640 are connected together in a series connection to provide a divide-by-two operation. The first flip-flop, flip-flop 638, is clocked by the REGCK clock signal on a line 642, which is input to the clock input through an inverter 644, the other clock input of the dual flip-flop connected to the output of the inverter 644 through an inverter 646. The Q-output of the second flip-flop 640 provides a control signal on a line 648 to the gate of a transistor 650 which has the source/drain path thereof connected between a reference voltage $V_{ref2}$ on a line 652 and a node 654. The Q-Bar output of flip-flop 640 is connected to one input of an AND gate 656, the other input thereof connected to the output of an inverter 658, the input thereof connected to the POR signal on line 634. Therefore, whenever POR goes low, the output of inverter goes high and, whenever the Q-Bar output goes high, the output of AND gate 656 goes high. The output of AND gate 656 is connected to the gate of a switching transistor 660.

The regulator has on the output thereof an opamp 662 with a positive input thereof connected to the node 654 and the negative input connected through a switch transistor 664 to a voltage divider comprised of a plurality of resistors connected between the power supply node and the $V_{SS}$ node. This provides a voltage of approximately 3.7 volts. This is a sense input for the power supply terminal which is basically the internal $V_{DD}$. The gate of transistor 664 is connected to the power supply node. Node 654 is connected to one side of the switch transistor 660, the other side thereof connected to a temporary reference voltage on a node 666, the node 666 connected to one side of a P-channel transistor 670 and one side of a P-channel transistor 672. The other side of transistor 670 is connected to the power supply terminal, with the gate thereof connected to a node 674. The other side of transistor 672 is connected to one side of the source/drain path of an N-channel transistor 676, the other side thereof connected to $V_{SS}$. The gates of transistors 672 and 676 are connected together and to the junction between transistors 672 and 676. Node 674 basically provides a bias voltage, which bias voltage is also provided to the opamp 662. The node 674 is connected to one side of the source/drain path of a P-channel transistor 678, the other side thereof connected to the power supply node. The gate of transistor 678 is connected to node 674. Node 674 is connected to the source/drain path of an N-channel transistor 680 to one side of a resistor 682, the other side thereof connected to $V_{SS}$. Transistor 680 has the base thereof connected to the base of a diode-connected N-channel transistor 684, the source/drain path thereof connected between a node 686 and ground. Node 686 is connected to one side of the source/drain path of a P-channel transistor 688, the other side thereof connected to the power supply node and the gate thereof connected to node 674. Node 674 is also connected to the gate of a P-channel transistor 690, the source/drain path thereof connected between the power supply node and a node 692. Node 692 is connected to the gate of a P-channel transistor 694, the source/drain path thereof connected between the power supply node and node 686. Node 692 is connected through two diode-connected N-channel transistors 696 and 698 connected in series and to the $V_{SS}$ terminal. In general, the structure connected to the node 666 is operable to generate a temporary reference signal which is switched to node 654 whenever the output of the NAND gate 656 is high. As described above, this occurs whenever POR is low and flip-flops 638 and 640 are reset or the Q-Bar output of flip-flop 640 is high. When the output of AND gate 656 goes low, i.e., when POR 634 goes high, transistor 660 is turned off.

The node 654 is also connected through a pull-up P-channel transistor 700 to the power supply node, with the gate thereof controlled by the output of the inverter 658. Therefore, whenever POR goes high, transistor 700 will turn on and pull node 654 high. However, whenever the Q-output of the flip-flop 640 goes high, this will turn on transistor 650 and the voltage $V_{ref2}$ on node 652 will be placed on node 654.

Referring now to FIG. 25, there is illustrated a timing diagram for the operation of the regulator of FIG. 24. Whenever the system on the battery monitor chip 10 detects that the voltage has fallen below a predetermined voltage level, an internal circuit generates a signal referred to as Power On Reset (POR). The circuitry for this detection is not shown but, in general, is conventional circuitry in the form of a comparator with the output thereof tied to a threshold generated by the bandgap generator 50. At this point, the output of the comparator will control a switch to switch the $V_{DD}$ internal node to the RBI output and the backup capacitor 34. At this time, the power to all of the system is shut down with the exception of the memory and the WOE registers are updated to indicate that the system is in a "shut down"mode. This system will maintain this mode until the voltage on $V_{DD}$ again rises above a predetermined threshold. At this time, the power is switched back over to the main battery. The system is then pulled out of the "Shut Down" Mode. It can be seen that the POR signal goes high at an edge 704 and will stay in that mode until the battery again goes high, at which time the POR signal will go low at an edge 706. When POR goes high, the output of inverter 658, labeled S1, will go low. This output is connected to one input of the NAND gate 656. The output of the NAND gate 656, labeled S3, will then go low, turning off transistor 660. The high signal on POR will cause the output of the NOR gate 636, labeled POFFC as the compliment of the POFF signal, to go low, wherein POFF will go high, as indicated by an edge 708. Since the S1 signal is low during POR high, the gate of transistor 700 will go low such that transistor 700 is on. However, the S2 node on the Q-output of flip-flop 640 is also pulled low, since the reset input on flip-flop 640 is at a reset mode. This will turn transistor 650 off. This will also cause the REG output to go high, turning the JFET hard to help move $V_{DD}$ above the predetermined voltage level of POR.

When POR goes low at edge 706, the POFF signal goes low and POFFC goes high, removing the reset from flip-flops 638 and 640. Flip-flops 638 and 640 require that there must be at least two sequential clock signals of the REGCK signal to occur before the Q-output goes high and the Q-Bar output goes low. At this point, S2 will go high at an edge 710 with S3 having previously gone high at an edge 712 as a result of POR going low. When S3 goes high, transistor 660 is turned on to connect the temporary reference voltage TREF on node 666 to the node 654. This will provide the REG output. Of course, the REG output will be dependent upon the TREF reference which is generated by the associated bias circuitry. The normal mode will then be delayed, as described above, until at least two cycles of the REGCK line 642 have occurred, this clock having a period of 10 ms approximately. This is due to the fact that it takes a number of clock cycles for all the timers to get to their operating modes. At this point in time, as indicated by the edge 710, the system enters the normal operating mode wherein S3 will go low due to the Q-Bar output on flip-flop 640 going low. The Q-output of flip-flop 640 will go high with S2 going high and transistor 650 turning on and connecting the $V_{ref}$ signal on line 652 to the node 654. S1 is basically pulled high at the edge 706 which will turn off transistor 700. Therefore, transistor 700 is only utilized to pull node 654 high during the POR mode.

Whenever the Sleep signal goes high, as indicated by an edge 714, this will cause S2 to go low since POFFC on the output of NOR gate 636 will go low, basically resetting flip-flops 638 and 640. This will cause S2 to go low, turning off transistor 650 and changing S3 to a high signal at an edge 716. This system will then enter the Sleep Mode. When the SLEEP signal is pulled low at an edge 718, POFF goes low and the output of NOR gate 636 goes high, removing the reset from flip-flops 638 and 640. After two clock cycles of the REGCK signal, S3 will go low at an edge 720 and S2 goes high at an edge 722 to enter the normal mode of operation. This will continue until POR goes high or SLEEP goes high.

In summary, there has been provided a battery charge/discharge monitor circuit that is operable to be disposed in a battery pack. This monitor circuit is operable to maintain information regarding the charge and discharge activity on a battery which information can be utilized by an external CPU for the purpose of determining various aspects of the battery such as charge capacity, charge level and such other items that are necessary for the control of a battery. The charge information is in the form of the amount of charge that is taken out of the battery and the time that the charge is taken out, the amount of charge input to the battery and the time that the charge is being input to the battery and self-discharge information. This information is stored in a memory located on the integrated circuit which is interfaced to the CPU through a single wire transmission bus. Therefore, there are a minimum of three wires required for the battery pack, one for the positive terminal of the battery, one for the negative terminal of the battery and one for the communication port. In addition to the single wire communication port, there is provided a single status signal that indicates activity of the part, this activity indicating that there is charge or discharge activity. The system also has a calibration feature that provides an offset value for charge and discharge activity to account for various non-linearities in the part. There is also provided temperature information of the environment around the part which can be output to the external CPU.

Although the preferred embodiment has been described in detail, it should be understood that various changes, substitutions and alterations can be made therein without departing from the spirit and scope of the invention as defined by the appended claims.

What is claimed is:

1. A battery monitoring circuit for monitoring select parameters of a battery having positive and negative terminals, comprising:
    a charge determination circuit for determining information relative to the current level input to the battery as a function of time;
    a charge accumulation register for storing an accumulated charge value representing the level of current input to the battery over the time that the current level was present, as determined by said charge determination circuit;
    a discharge determination circuit for determining information relative to the current level output from the battery as a function of time;
    a discharge accumulation register for storing an accumulated discharge value representing the level of current output from the battery over the time that the current level was present, as determined by said discharge determination circuit; and
    an input/output interface for allowing an external system to access the contents of said charge accumulation register and discharge accumulation register and the information stored therein.

2. The monitoring circuit of claim 1, and further comprising:
    a charge timer for determining the amount of time said charge determination circuit is operating;
    a discharge timer for determining the amount of time said discharge determination circuit is operating;
    a discharge time register for storing information representing the accumulated time that said discharge timer is operating;
    a charge time register for storing information representing the accumulated time that said charge timer is operating; and
    wherein said discharge time register and charge time register are accessible by said external system through said Input/output interface.

3. The monitoring circuit of claim 1, wherein a sense resistor is disposed in series with one of said positive and negative terminals of the battery and each of said charge and discharge determining devices comprises:
    a voltage-to-frequency converter circuit for converting the voltage across the sense resistor to a pulse stream wherein each pulse represents a predetermined voltage level per unit time and at opposite polarities for each of said charge and discharge determination circuits; and
    a counter clocked by said voltage-to-frequency converter pulse stream, the output of said counter stored in the respective one of said charge accumulation and discharge accumulation registers.

4. The monitoring circuit of claim 3, wherein said unit time measurement is one hour.

5. The monitoring circuit of claim 1, and further comprising a sleep device operable to reduce current draw to the monitor circuit in response to a signal from said external system through said Input/output interface and the charge or discharge levels determined by said charge determination and discharge determination circuits being below a predetermined threshold.

6. The monitoring circuit of claim 5, wherein said sleep device includes an internal comparator for comparing the output value from said charge determination and discharge determination devices with a stored sleep threshold value stored in a sleep threshold register and generating a true value indicating activity below a desired level when this value is less than said stored sleep threshold value.

7. The monitoring circuit of claim 6, wherein said sleep threshold register is accessible by said external system through said Input/output interface to allow said external system to input said sleep threshold value to said sleep threshold register.

8. The monitoring circuit of claim 1, and further comprising a calibration circuit for determining the error in said charge determination and discharge determination circuits and storing a calibration value in a calibration value register accessed by said external system through said Input/output interface.

9. The monitoring circuit of claim 8, wherein said calibration circuit operates in response to an external calibration signal received from said external system through said Input/output interface.

10. The monitoring circuit of claim 9, wherein said external calibration signal is stored in a calibration register.

11. The monitoring circuit of claim 9, wherein said calibration circuit operates only when said external calibration signal is received and the output of each of said charge determining and discharge determining circuits is below a predetermined threshold.

12. The monitoring circuit of claim 8, wherein said calibration circuit comprises:
  a calibration timer for operating said calibration circuit for a predetermined period of time; and
  a difference circuit for determining the accumulated difference between the accumulated outputs of said charge determination and discharge determination circuits for said predetermined period of time.

13. The monitoring circuit of claim 1, wherein said Input/output interface operates to access information stored in said charge accumulation register and said discharge accumulation register only upon a request for such information from said external system.

14. The monitoring circuit of claim 1, wherein said Input/output interface comprises a serial bus data interface.

15. The monitoring circuit of claim 14, wherein said serial bus data interface comprises a single wire interface.

16. The monitoring circuit of claim 15, wherein the battery monitoring circuit and battery are disposed in a battery pack with a minimum of three terminals interfaced thereto, the positive and negative battery terminals and said single wire interface.

17. The monitoring circuit of claim 1, and further comprising an activity determining device for monitoring the output of said charge determination circuit and said discharge determination circuit and, if the outputs of said charge and discharge determining circuits are less than a predetermined threshold value, outputting a signal to said external system through a second Input/output interface indicating a lack of activity, the absence of said signal indicating activity to said external system.

18. A system for monitoring select parameters of a battery having positive and negative terminals, comprising:
  a charge determination circuit for determining information relative to the current level input to the battery as a function of time;
  a charge accumulation register for storing an accumulated charge value representing the level of current input to the battery over the time that the current level was present, as determined by said charge determination circuit;
  a discharge determination circuit for determining information relative to the current level output from the battery as a function of time;
  a discharge accumulation register for storing an accumulated discharge value representing the level of current output from the battery over the time that the current level was present, as determined by said discharge determination circuit;
  a CPU for determining the parameters of the battery utilizing information in said charge determination circuit, said charge accumulation register, said discharge determination circuit and said discharge accumulation register; and
  an input/output interface for interfacing said CPU to the contents of said charge accumulation register and discharge accumulation register and the information stored therein.

19. A method for monitoring select parameters of a battery having positive and negative terminals, comprising:
  determining information relative to the current input to the battery as a function of time with a charge determination circuit;
  storing an accumulated charge value representing the amount of current input to the battery over time in a charge accumulation register, as determined by the charge determination circuit;
  determining information relative to the current output from the battery as a function of time with a discharge determination circuit;
  storing an accumulated discharge value representing the amount of current output from the battery as a function of time in a discharge accumulation register, as determined by the discharge determination circuit; and
  providing an interface with an external system to allow access thereby to the charge accumulation register and discharge accumulation register and the information stored therein.

20. The method of claim 19, and further comprising the steps of:
  determining with a charge timer the amount of time the charge determination circuit is operating;
  determining with a discharge timer the amount of time the discharge determination circuit is operating;
  storing information in a discharge time register representing the accumulated time that the discharge timer is operating;
  storing information in a charge time register representing the accumulated time that the charge timer is operation; and
  wherein the discharge time register and charge time register are accessible by the external system through the step of providing.

21. The method of claim 19, and further comprising the steps of disposing a sense resistor in series with one of the positive and negative terminals of the battery and the step of determining information relative to the current input and determining information relative to the current output each comprising the steps of:
  providing a voltage-to-frequency converter circuit;
  converting the voltage across the sensor resister to a pulse stream with the voltage-to-frequency converter circuit wherein each pulse represents a predetermined voltage level per unit of time and at opposite polarities for each of the charge and discharge determination circuits; and clocking a counter with the voltage-to-frequency converter pulse stream, and storing the output of the counter in the respective one of the charge accumulation and discharge accumulation registers.

22. The method of claim 21, wherein a unit of time measurement is one hour.

23. The method of claim 19, and further comprising the step of reducing current draw to the overall operation in response to a signal from the external system and the charge or discharge levels determined by the charge determination and discharge determination circuits being below a predetermined threshold.

24. The method of claim 23, wherein the step of reducing current draw includes the steps of comparing the output value for the charge determination and discharge determination devices with a stored sleep threshold value stored in a sleep threshold register and then generating a true value indicating activity below a desired level when this value is less than the stored sleep threshold value.

25. The method of claim 24, wherein the sleep threshold register is accessible by the CPU device to allow the external system to input the sleep threshold value to the sleep threshold register.

26. The method of claim 19, and further comprising the step of determining the error in the charge determination and discharge determination circuits and storing a calibration value in a calibration value register accessible by the external system.

27. The method of claim 26, wherein the step of determining the error operates in response to a calibration signal received from the external system.

28. The method of claim 27, wherein the calibration signal is stored in a calibration register.

29. The method of claim 27, wherein the step of determining the error operates only when the calibration signal is received from the CPU device and the output of each charge determining and discharge determining circuits is below a predetermined threshold.

30. The method of claim 27, wherein the step of determining the error comprises the steps of:

controlling the operation of the calibration circuit with a calibration timer and operating the calibration circuit for a predetermined period of time as defined by the calibration timer; and determining the accumulated difference between the accumulated outputs of the charge determination and discharge determination circuits for the predetermined period of time.

31. The method of claim 19, and further comprising the step of monitoring the output of the charge determination circuit and the discharge determination circuit and, if the outputs of the charge and discharge determination circuits are less than a predetermined threshold value, outputting a signal to the CPU device indicating a lack of activity, the absence of the signal indicating activity to the CPU device.

\* \* \* \* \*